(12) United States Patent
Park et al.

(10) Patent No.: US 11,665,949 B2
(45) Date of Patent: May 30, 2023

(54) DISPLAY PANEL

(71) Applicant: Samsung Display Co., Ltd., Yongin-si (KR)

(72) Inventors: Kisoo Park, Hwaseong-si (KR); Junghyun Kwon, Yongin-si (KR); Youngmin Kim, Asan-si (KR); Hae Il Park, Seoul (KR); Seon-Tae Yoon, Hwaseong-si (KR); Hyeseung Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 310 days.

(21) Appl. No.: 17/065,720

(22) Filed: Oct. 8, 2020

(65) Prior Publication Data

US 2021/0225943 A1  Jul. 22, 2021

(30) Foreign Application Priority Data

Jan. 21, 2020  (KR) .................. 10-2020-0007950

(51) Int. Cl.
  *H01L 27/32* (2006.01)
  *H01L 51/52* (2006.01)

(52) U.S. Cl.
  CPC ........ *H01L 27/322* (2013.01); *H01L 51/5281* (2013.01); *H01L 51/5284* (2013.01); *H01L 27/3246* (2013.01)

(58) Field of Classification Search
  CPC .............. H01L 27/322; H01L 51/5281; H01L 51/5284; H01L 27/3246
  See application file for complete search history.

(56) References Cited

U.S. PATENT DOCUMENTS

| | | | |
|---|---|---|---|
| 9,524,068 B2* | 12/2016 | Kita ...................... | G06F 3/0412 |
| 9,618,793 B2* | 4/2017 | Nam .................. | G02F 1/133528 |
| 10,089,944 B2* | 10/2018 | Zhao .................... | G02F 1/1345 |
| 10,203,546 B2 | 2/2019 | Chae et al. | |
| 10,297,654 B2 | 5/2019 | Motoyama et al. | |
| 10,431,640 B2* | 10/2019 | Lee ..................... | H01L 27/3258 |

(Continued)

FOREIGN PATENT DOCUMENTS

KR  10-2012-0111912 A  10/2012
KR  10-2015-0091981 A  8/2015

(Continued)

*Primary Examiner* — Ali Naraghi
*Assistant Examiner* — Siangluai Mang
(74) *Attorney, Agent, or Firm* — Lewis Roca Rothgerber Christie LLP

(57) ABSTRACT

A display panel may include a first display substrate and a second display substrate on the first display substrate. The second display substrate may include a plurality of pixel regions and a peripheral region adjacent to the pixel regions. The second display substrate may include a first color control pattern configured to emit light of a first color, a second color control pattern spaced apart from the first color control pattern in a first direction and configured to emit light of a second color different from the first color, and first and second light-blocking patterns in the peripheral region between the first and second color control patterns. The first and second light-blocking patterns may be spaced apart from each other, in a second direction crossing the first direction, to define a gap region.

20 Claims, 14 Drawing Sheets

(56) References Cited

U.S. PATENT DOCUMENTS

| | | | |
|---|---|---|---|
| 10,884,532 B2* | 1/2021 | Shin | H01L 27/323 |
| 2012/0098414 A1 | 4/2012 | Nakamura | |
| 2013/0001724 A1* | 1/2013 | Masuda | H01L 27/14629 |
| | | | 257/E31.127 |
| 2016/0342043 A1* | 11/2016 | Nakanishi | G09G 3/3225 |
| 2017/0062528 A1* | 3/2017 | Aoyama | G02F 1/133514 |
| 2018/0122836 A1* | 5/2018 | Kang | H01L 33/54 |
| 2018/0308883 A1* | 10/2018 | Yanagita | H01L 27/14605 |
| 2019/0131374 A1* | 5/2019 | Kishimoto | H01L 51/5253 |
| 2019/0302519 A1* | 10/2019 | Park | G02B 5/201 |
| 2020/0052170 A1* | 2/2020 | Qi | G02B 6/0055 |
| 2020/0303465 A1 | 9/2020 | Joo et al. | |
| 2022/0045139 A1* | 2/2022 | Nakamura | H01L 27/3276 |

FOREIGN PATENT DOCUMENTS

| | | |
|---|---|---|
| KR | 10-2016-0027600 A | 3/2016 |
| KR | 10-2018-0008950 A | 1/2018 |
| KR | 10-2020-0130570 A | 11/2020 |

* cited by examiner

DISPLAY PANEL

CROSS-REFERENCE TO RELATED APPLICATION

This application claims priority to and the benefit of Korean Patent Application No. 10-2020-0007950, filed on Jan. 21, 2020, in the Korean Intellectual Property Office (KIPO), the entire content of which is incorporated by reference herein.

BACKGROUND

1. Field

One or more embodiments of the present disclosure relate to a display panel, and in particular, to a display panel including quantum dots.

2. Description of the Related Art

Display panels may include an emission-type display panel for generating a source light using a light source and a transmission-type display panel for selectively transmitting the source light generated by the light source. In order to produce a color image, the display panel includes different kinds of color control layers according to the type of pixels. The color control layer transmits the source light in a specific wavelength range or causes a change in color of the source light. In some cases, the color control layer changes other optical characteristics of the source light without changing the color of the source light.

SUMMARY

Aspects of one or more embodiments of the inventive concept are directed toward a display panel with increased life span and improved light extraction efficiency.

According to an embodiment of the inventive concept, a display panel may include a first display substrate including first electrodes and a pixel definition layer, the pixel definition layer including openings exposing the first electrodes, and a second display substrate on the first display substrate, the second substrate including a plurality of pixel regions and a peripheral region adjacent to the pixel regions. The second display substrate may include a first color control pattern configured to emit light of a first color, a second color control pattern spaced apart from the first color control pattern in a first direction and configured to emit light of a second color different from the first color, and a first light-blocking pattern and a second light-blocking pattern in the peripheral region between the first color control pattern and the second color control pattern. The first light-blocking pattern and the second light-blocking pattern may be spaced apart from each other, in a second direction crossing the first direction, to define a gap region.

In an embodiment, the display panel may further include a filling layer in the gap region and between the first display substrate and the second display substrate.

In an embodiment, the filling layer may cover the first color control pattern, the second color control pattern, the first light-blocking pattern, and the second light-blocking pattern.

In an embodiment, the pixel regions may include a first pixel row including a first pixel region overlapped with the first color control pattern and a second pixel region overlapped with the second color control pattern, and a second pixel row including a third pixel region overlapped with the first color control pattern and a fourth pixel region overlapped with the second color control pattern, the second pixel row being spaced apart from the first pixel row in the second direction. The first light-blocking pattern may be between the first pixel region and the second pixel region, and the second light-blocking pattern may be between the third pixel region and the fourth pixel region.

In an embodiment, the second display substrate may include a first color filter extended in the second direction and is overlapped with the first pixel region and the third pixel region, and a second color filter extended in the second direction, is overlapped with the second pixel region and the fourth pixel region, and is spaced apart from the first color filter in the first direction. The first color filter and the second color filter may filter different colors from each other.

In an embodiment, the second display substrate may include a first color filter, a second color filter, a third color filter, and a fourth color filter, each of the first color filter, the second color filter, the third color filter, and the fourth color filter are spaced apart from each other in the first direction and the second direction, and overlapped with a corresponding one of the first pixel region, the second pixel region, the third pixel region, and the fourth pixel region.

In an embodiment, at least one of the first light-blocking pattern or the second light-blocking pattern may include a plurality of patterns that are spaced apart from each other in the second direction.

In an embodiment, the first light-blocking pattern and the second light-blocking pattern may have different shapes from each other.

In an embodiment, the first display substrate may include a gate line extending in the first direction and a data line extending in the second direction and crossing the gate line. The data line and the gate line may be electrically disconnected from each other, and the gate line may be overlapped with the gap region.

In an embodiment, the data line may be overlapped with the first light-blocking pattern and the second light-blocking pattern.

In an embodiment, the first display substrate may include a plurality of light-emitting patterns comprising a first light-emitting pattern and a second light-emitting pattern, the first light-emitting pattern and the second light-emitting pattern being on a corresponding one of the first electrodes and being spaced apart from each other. The first light-emitting pattern and the second light-emitting pattern may be overlapped with the first color control pattern and the second color control pattern, respectively.

In an embodiment, the first display substrate may include a single light emitting layer covering the first electrodes and the pixel definition layer.

In an embodiment, the light emitting layer may emit a blue light.

In an embodiment, the first color control pattern and the second color control pattern may include quantum dots.

In an embodiment, the first light-blocking pattern and the second light-blocking pattern may have light transmittance of about 10% or lower.

In an embodiment, the first light-blocking pattern and the second light-blocking pattern may include an optically reflective material.

In an embodiment, at least one of the first light-blocking pattern or the second light-blocking pattern may have a circular, elliptical, or polygonal shape, when viewed in a plan view.

In an embodiment, the upper display substrate may further include a partitioning pattern defining the peripheral region and having a grid shape enclosing the pixel regions, and the partitioning pattern may include a light-blocking material.

In an embodiment, the partitioning pattern may be provided to define an opening overlapped with the gap region.

In an embodiment, each of the pixel regions may include short sides parallel to the first direction, and long sides connected to the short sides and parallel to the second direction. The first light-blocking pattern and the second light-blocking pattern may be between opposite long sides of different ones of the pixel regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
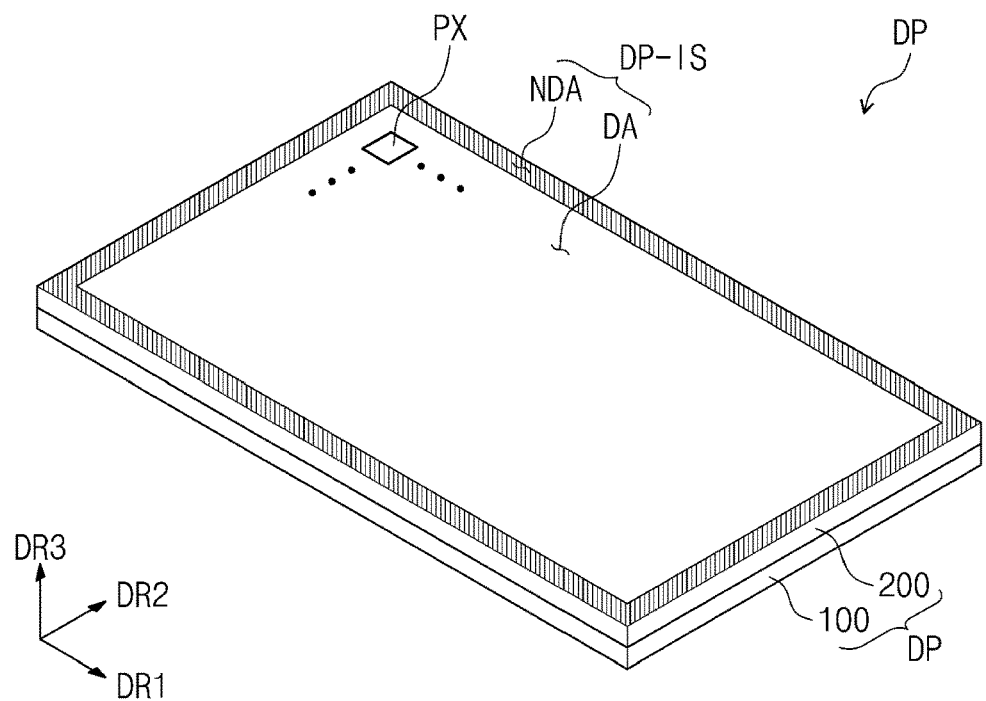
FIG. 1A is a perspective view illustrating a display panel according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus repeated description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, expressions such as "at least one of", "one of", and "selected from", when preceding a list of elements, modify the entire list of elements and do not modify the individual elements of the list.

Further, the use of "may" when describing embodiments of the present disclosure refers to "one or more embodiments of the present disclosure".

As used herein, the phrases such as, "a plan view" may refer to a view from top or from a direction normal to the display panel of the display device.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
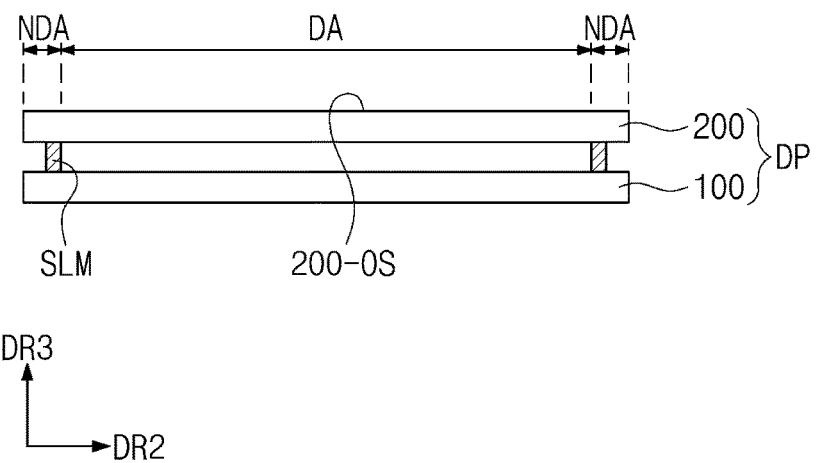
FIG. 1B is a cross-sectional view illustrating a display panel according to an embodiment of the inventive concept.
Figure 2:
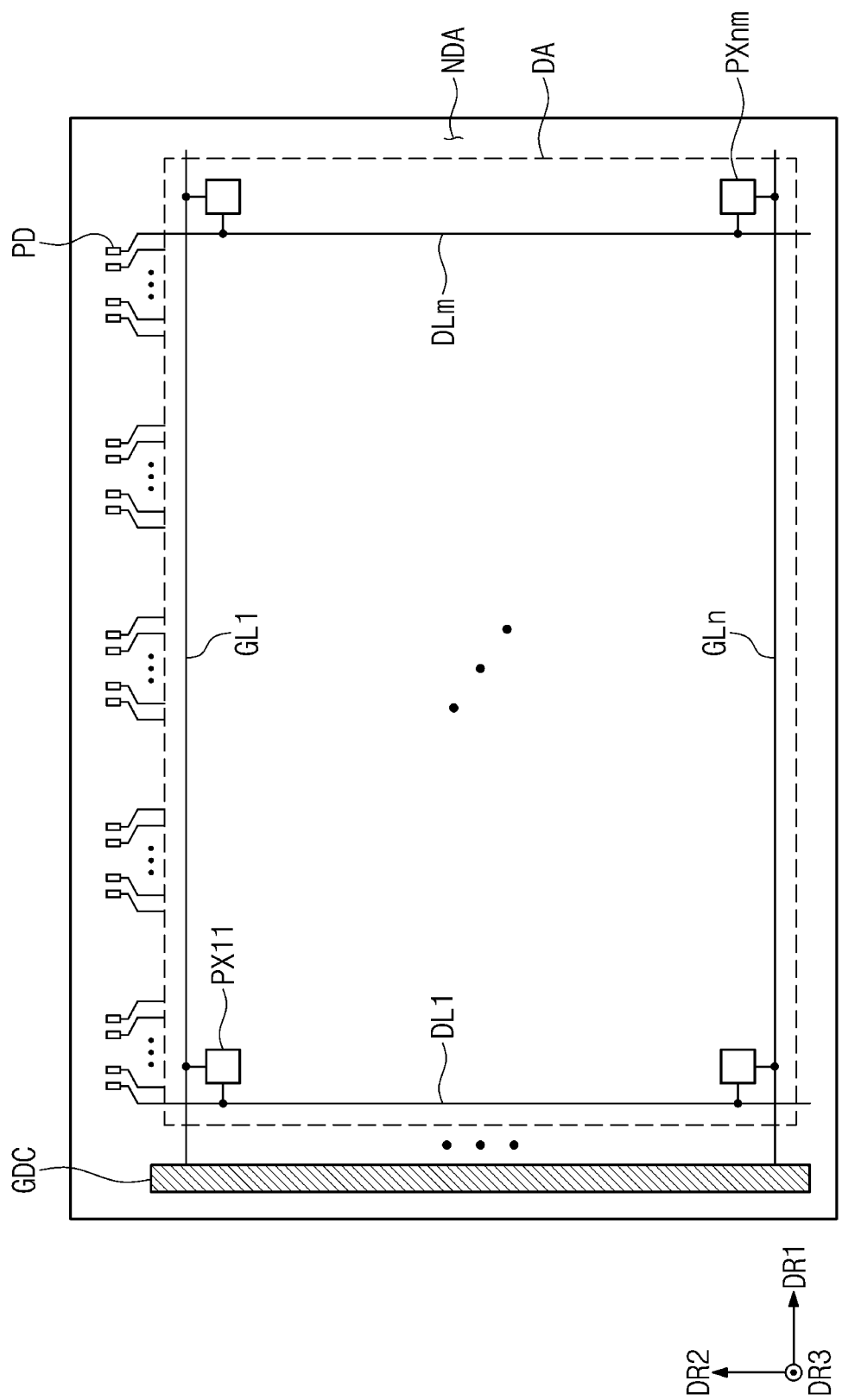
FIG. 2 is a plan view illustrating a display panel according to an embodiment of the inventive concept.

FIG. 1A is a perspective view illustrating a display panel according to an embodiment of the inventive concept. FIG. 1B is a cross-sectional view illustrating a display panel according to an embodiment of the inventive concept. FIG. 2 is a plan view illustrating a display panel according to an embodiment of the inventive concept.

Referring to FIGS. 1A-2, a display panel DP may be one of a liquid crystal display panel, an electrophoretic display panel, a microelectromechanical system (MEMS) display panel, an electrowetting display panel, and/or an organic light emitting display panel, but the inventive concept is not limited to this example.

In one or more embodiments, the display panel DP may further include a chassis member and/or a molding member and, depending on the kind of display panel DP, may receive light provided from an additional backlight unit.

The display panel DP may include a first display substrate 100 (or a lower display substrate) and a second display substrate 200 (or an upper display substrate), which are spaced apart from each other. In one or more embodiments, the first display substrate 100 and the second display substrate 200 face (e.g., may be opposite to) each other. A cell gap may be formed between the first display substrate 100 and the second display substrate 200. The cell gap may be maintained by a sealant SLM, which is used to couple the first display substrate 100 to the second display substrate 200. In other words, the sealant SLM couples the first display substrate 100 to the second display substrate 200 such that the sealant SLM, the first display substrate 100, and the second display substrate 200 define a cell gap. The cell gap may be filled with a filling layer, which will be described in more detail below.

A display device, which is used to produce an image, may be disposed between the first display substrate 100 and the second display substrate 200. The display device may include a liquid crystal capacitor, an organic light emitting device, an electrophoretic device, a quantum-dot emission device, and/or an ultra-small emission device (e.g., micro or nano LED), depending on the kind of the display panel DP.

As shown in FIG. 1A, the display panel DP may include a display surface DP-IS to display an image. An outer surface 200-OS of the second display substrate 200 shown in FIG. 1B may be referred to as the display surface DP-IS.

The display surface DP-IS may be parallel to a plane defined by a first direction axis DR1 and a second direction axis DR2. In other words, the display surface DP-IS may be flat or substantially flat in the plane define by the DR1 and DR2 axes. The display surface DP-IS may include a display region DA and a non-display region NDA. A pixel PX may be disposed in the display region DA but may not be disposed in the non-display region NDA. The non-display region NDA may be defined along an edge of the display surface DP-IS. In one or more embodiments, the display region DA may be enclosed in (or surrounded by) the non-display region NDA. In an embodiment, the non-display region NDA may be omitted or may be locally disposed near one side portion of the display region DA. In other words, the display surface DP-IS may include only the display region DA or may include the non-display region NDA adjacent to only one side portion of the display region DA.

A direction normal to the display surface DP-IS (i.e., a thickness direction of the display panel DP) will be referred to as a third direction axis DR3. The third direction axis DR3 may be used to differentiate a front surface (or a top surface) of each element (e.g., a layer or a unit) from a back surface (or a bottom surface). However, the first to third direction axes (the first direction axis DR1, the second direction axis DR2, and the third direction axis DR3) illustrated in the present embodiment may be just an example. In other words, the first to third direction axes DR1, DR2, and DR3 may be spatially relative axes intended to encompass different orientations of the device in use or operation in addition to the orientation depicted in the figures. Hereinafter, first to third directions may be defined as directions indicated by the first to third direction axes DR1, DR2, and DR3, respectively, and will be identified with the same reference numbers.

In an embodiment, the display panel DP is illustrated to have a flat-type (flat) display surface DP-IS, but the inventive concept is not limited to this example. The display panel DP may have any suitable display surface DP-IS, for example, the display panel DP may have a curved display surface or a three-dimensional display surface. The three-dimensional display surface may include a plurality of display regions, which are oriented in (or face) different directions.

FIG. 2 illustrates the arrangement of signal lines (e.g., gate lines GL1-GLn and data lines DL1-DLm) and pixels PX11-PXnm viewed in a plan view. The signal lines (e.g., gate lines GL1-GLn and data lines DL1-DLm) may include a plurality of gate lines GL1-GLn and a plurality of data lines DL1-DLm.

Each of the pixels PX11-PXnm may be connected to a corresponding one of the gate lines GL1-GLn and a corresponding one of the data lines DL1-DLm. Each of the pixels PX11-PXnm may include a pixel driving circuit and a display element. Depending on the structure of the pixel driving circuit of the pixels PX11-PXnm, signal lines of other types may be further provided in the display panel DP.

Although the pixels PX11-PXnm are arranged in a matrix shape in FIG. 2, the inventive concept is not limited to this example. For example, the pixels PX11-PXnm may be arranged in any suitable shape such as a pentile matrix shape (PENTILE® is a registered trademark of Samsung Display Co., Ltd., Republic of Korea), which is one of diamond arrangement structures.

The gate lines GL1-GLn may be connected to a gate driving circuit GDC. The gate driving circuit GDC may provide a gate or scan signal to the gate lines GL1-GLn. The gate driving circuit GDC may be integrated on the display panel DP through an oxide silicon gate (OSG) driver circuit process or an amorphous silicon gate (ASG) driver circuit process. However, the inventive concept is not limited to this example, and in an embodiment, the gate driving circuit GDC and the display panel DP may be separately disposed on different substrates and may be coupled to each other.

The data lines DL1-DLm may include end portions, which are provided in the non-display region NDA are used as pads PD. The data lines DL1-DLm may be coupled to an external data driving circuit through the pads PD. The data lines DL1-DLm may be used to provide data signals, which are received through the data driving circuit, to corresponding ones of the pixels.

Figure 3A:
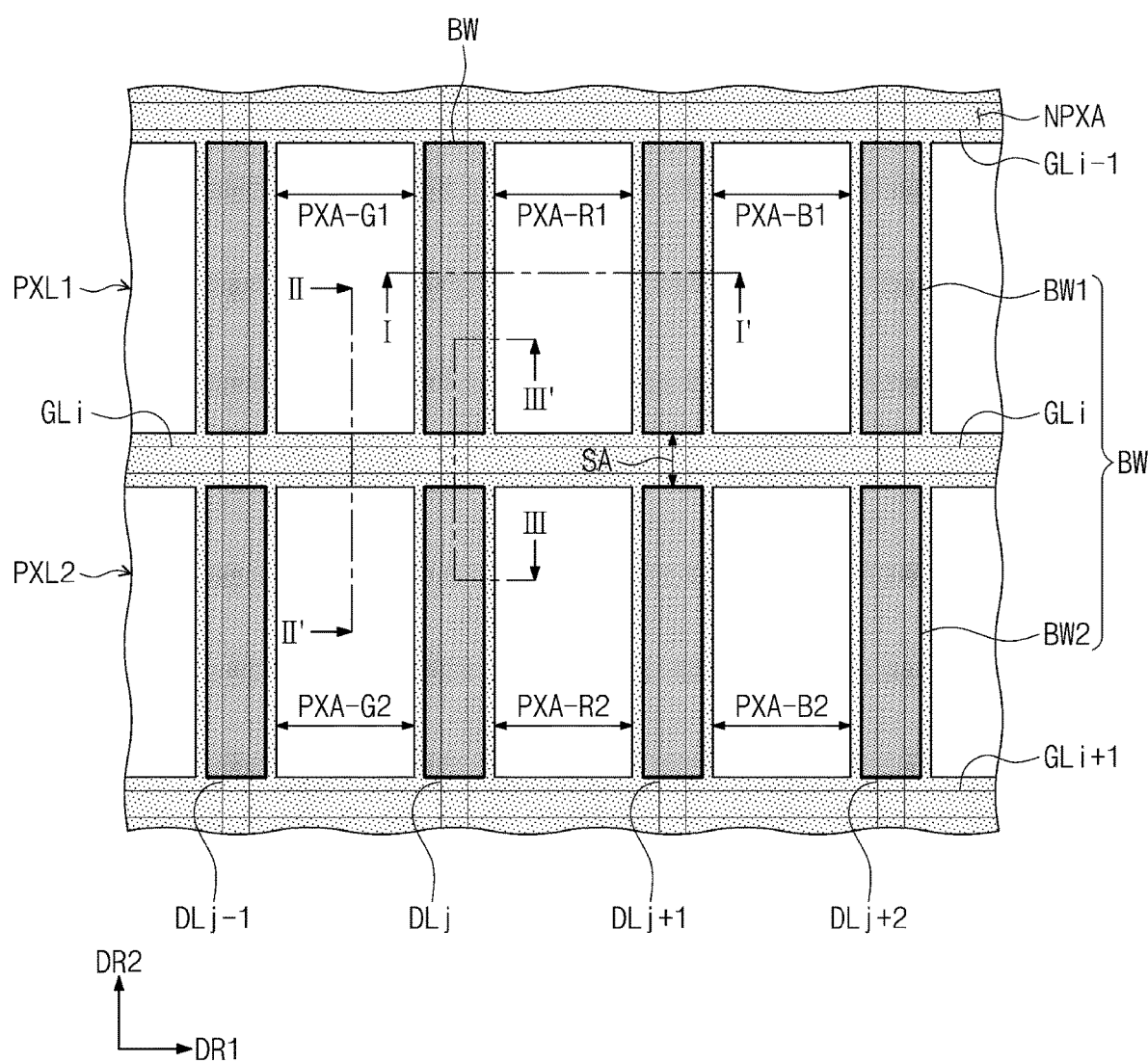
FIG. 3A is a plan view illustrating a display region of a display panel according to an embodiment of the inventive concept.
Figure 3B:
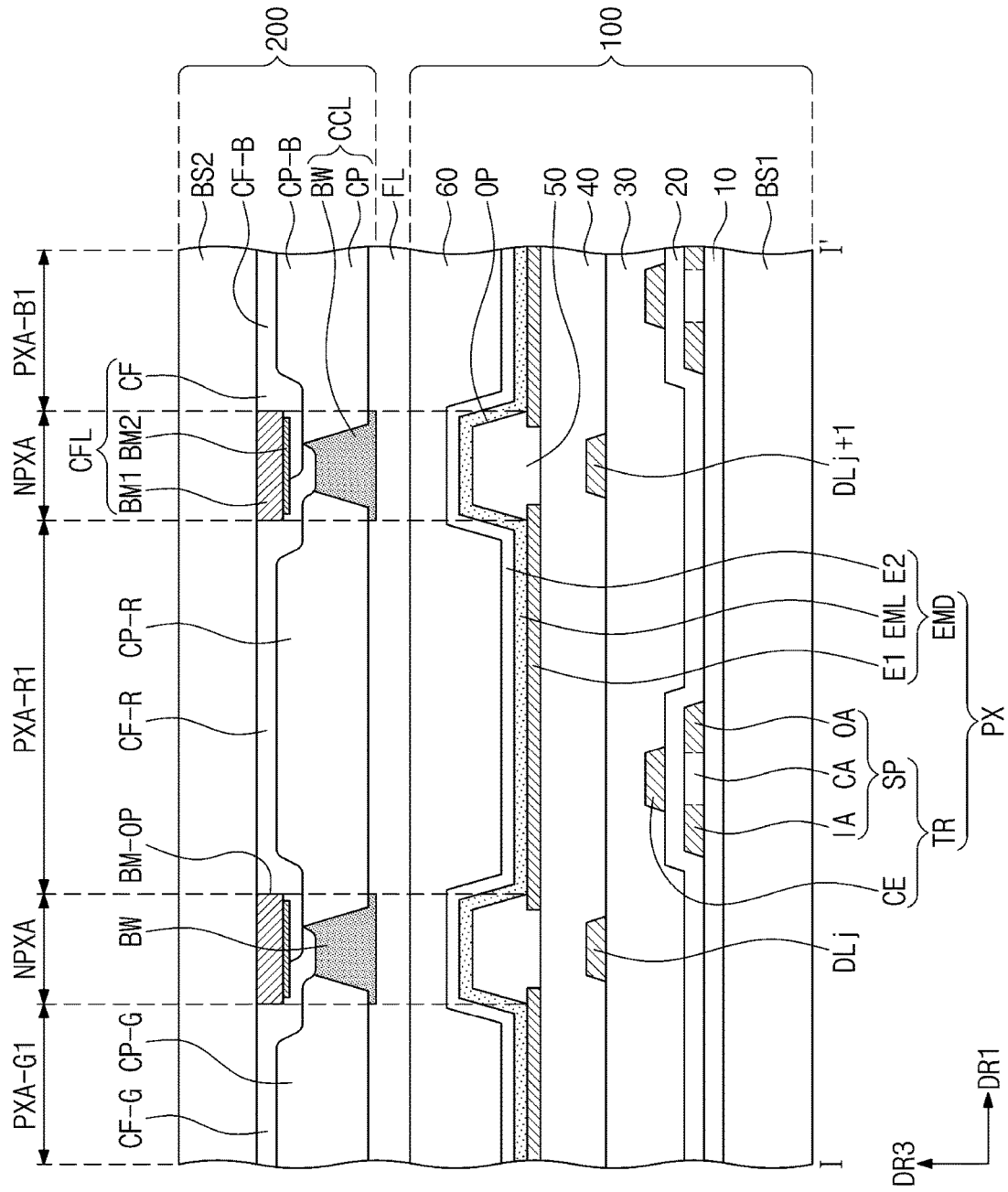
FIGS. 3B-3D are cross-sectional views taken along the lines I-I', and III-III' respectively of FIG. 3A illustrating a display panel according to an embodiment of the inventive concept.
Figure 3C:
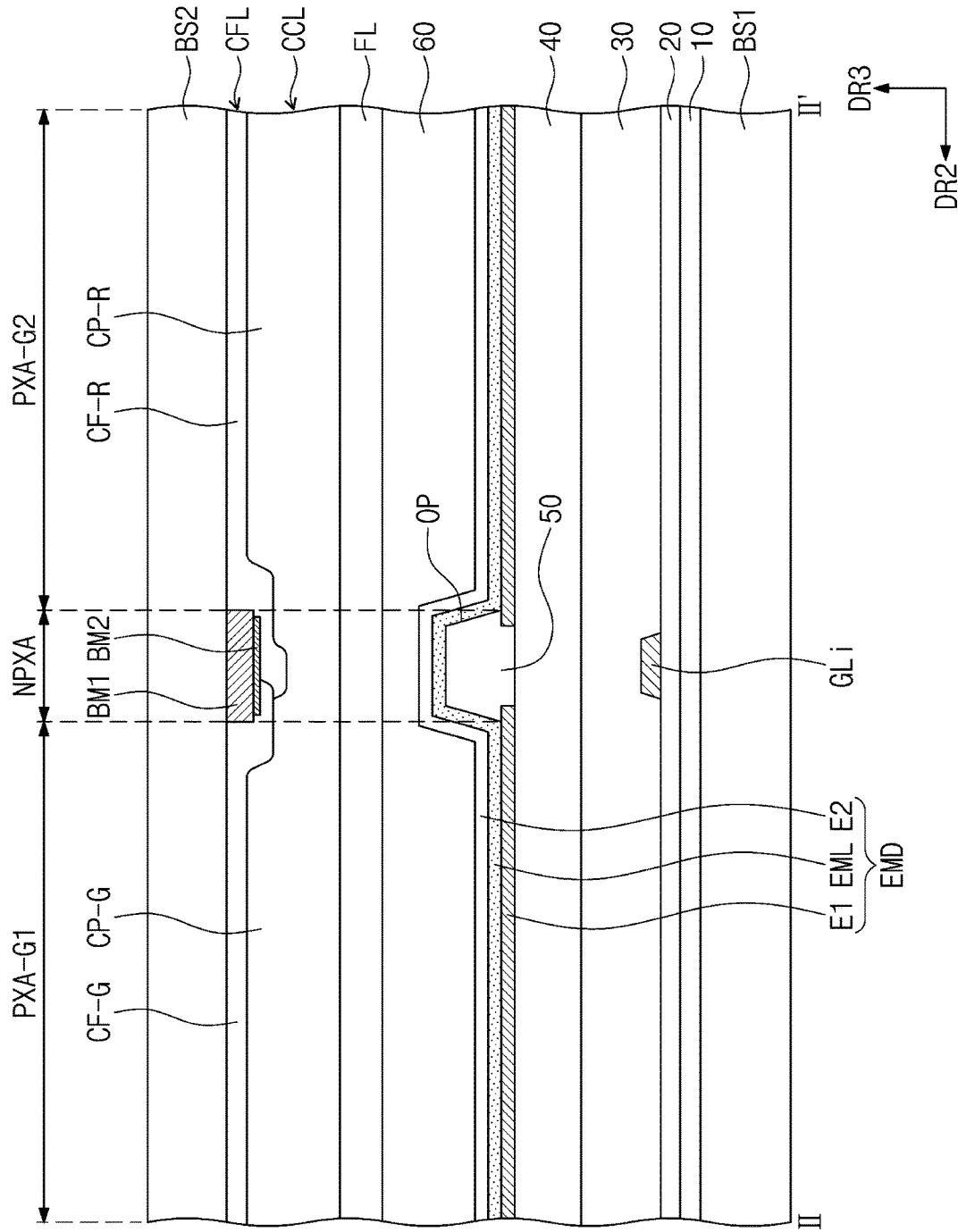
Figure 3D:
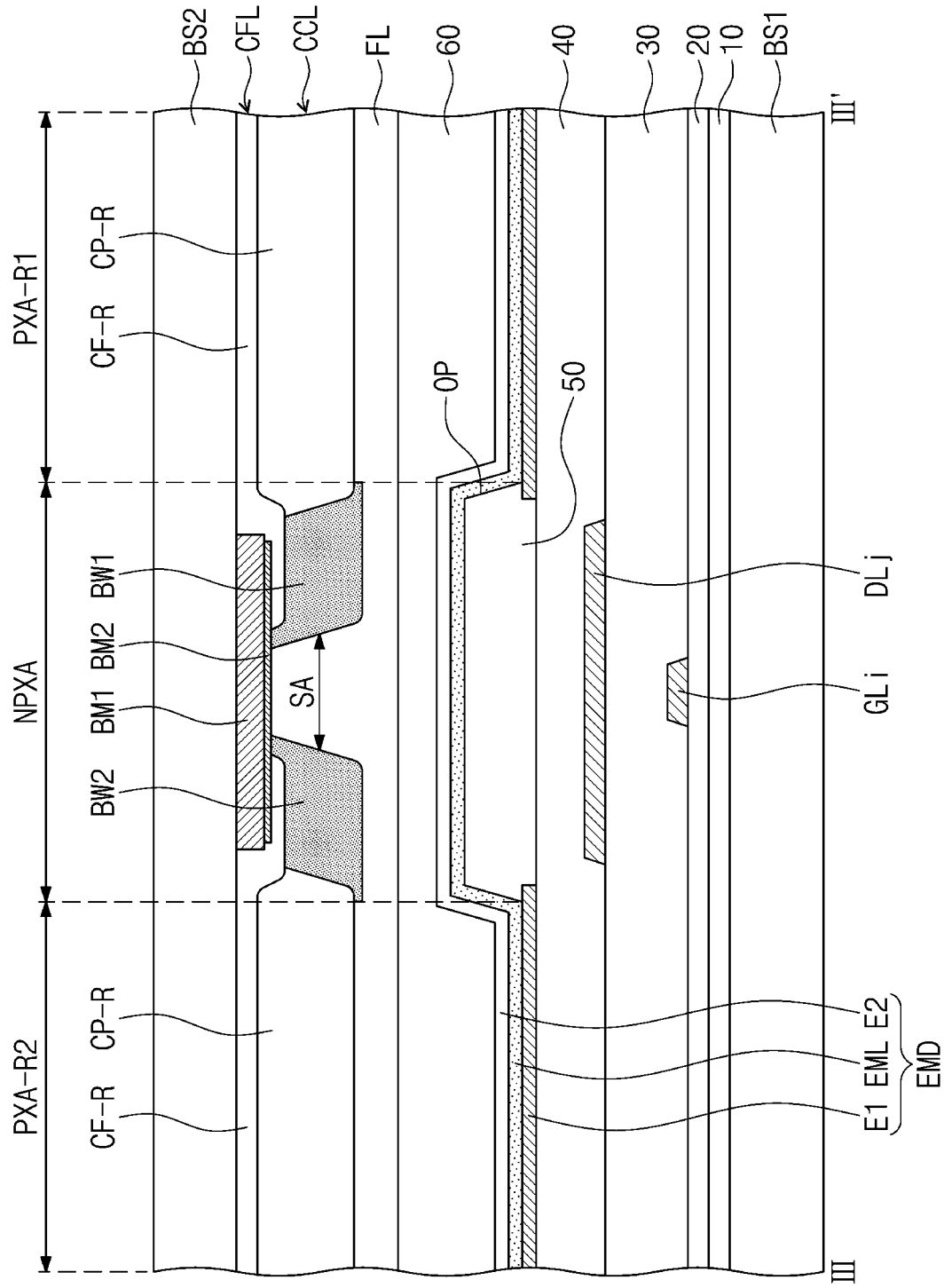

FIG. 3A is a plan view illustrating a display region of a display panel according to an embodiment of the inventive concept. FIGS. 3B-3D are cross-sectional views illustrating a display panel according to an embodiment of the inventive concept. FIG. 3A illustrates a plurality of pixel regions PXA-G1, PXA-R1, PXA-B1, PXA-G2, PXA-R2, and PXA-B2 as viewed in a direction (e.g., a direction opposite to the third direction) toward the outer surface 200-OS of the second display substrate 200 shown in FIG. 1B. FIG. 3A exemplarily illustrates six pixel regions PXA-G1, PXA-R1, PXA-B1, PXA-G2, PXA-R2, and PXA-B2 constituting two pixel rows PXL1 and PXL2. FIG. 3B is a cross-sectional view taken along the line I-I' of FIG. 3A. FIG. 3C is a cross-sectional view taken along the line II-II' of FIG. 3A, and FIG. 3D is a cross-sectional view taken along the line III-III' of FIG. 3A.

In the present embodiment, the pixel regions PXA-G1, PXA-R1, PXA-B1, PXA-G2, PXA-R2, and PXA-B2 shown in FIG. 3A may be spaced apart from each other and repeatedly disposed throughout the display region DA. A peripheral region NPXA may be disposed around each of the pixel regions PXA-G1, PXA-R1, PXA-B1, PXA-G2, PXA-R2, and PXA-B2. The peripheral region NPXA may delimit the pixel regions PXA-G1, PXA-R1, PXA-B1, PXA-G2, PXA-R2, and PXA-B2 and may prevent or substantially prevent a color-mixing issue from occurring between the pixel regions PXA-G1, PXA-R1, PXA-B1, PXA-G2, PXA-R2, and PXA-B2.

In an embodiment, the pixel regions PXA-G1, PXA-R1, PXA-B1, PXA-G2, PXA-R2, and PXA-B2 may be defined by opening BM-OP formed in a first partitioning pattern BM1. An area of the opening BM-OP may be given as the largest value of an area, in which light produced by each emission device EMD can be emitted to the outside, without the color-mixing issue with neighboring emission devices. In one or more embodiments, the opening BM-OP may have any suitable area up to the largest area in which light produced by each emission device EMD can be emitted to the outside without color-mixing issues with neighboring emission devices. Thus, a region provided with the first partitioning pattern BM1 may be defined as the peripheral or non-pixel region NPXA, and regions corresponding to the openings BM-OP may be defined as the pixel regions PXA-G1, PXA-R1, PXA-B1, PXA-G2, PXA-R2, and PXA-B2, to which lights produced by the emission devices EMD are provided. In an embodiment, a light-blocking pattern BW may be provided to be overlapped (e.g., overlapped in the third direction) with a portion of the peripheral or non-pixel region NPXA.

In the present embodiment, the first to sixth pixel regions (first pixel region PXA-G1, second pixel region PXA-R1, third pixel region PXA-B1, fourth pixel region PXA-G2, fifth pixel region PXA-R2, and sixth pixel region PXA-B2) are illustrated as having the same planar area, but the inventive concept is not limited to this example. For example, in one or more embodiments, at least two of the first to sixth pixel regions PXA-G1, PXA-R1, PXA-B1, PXA-G2, PXA-R2, and PXA-B2 may have different areas from each other. Although the pixel regions PXA-G1, PXA-R1, PXA-B1, PXA-G2, PXA-R2, and PXA-B2 each have a rectangular shape when viewed in a plan view in FIG. 3A, the inventive concept is not limited to this example. For example, when viewed in a plan view, the first to sixth pixel regions PXA-G1, PXA-R1, PXA-B1, PXA-G2, PXA-R2, and PXA-B2 may have any other suitable polygonal shape (e.g., a rhombus or a pentagon).

In the present embodiment, the first to third pixel regions PXA-G1, PXA-R1, and PXA-B1 may be arranged to constitute a first pixel row PXL1 and may be configured to display lights of different colors. For example, the first to third pixel regions PXA-G1, PXA-R1, and PXA-B1 may be configured to emit red, green, and blue lights, respectively. In the present embodiment, the blue light may correspond to a source light, and the third pixel region PXA-B1 may be a pixel region emitting the source light.

Similarly, the fourth to sixth pixel regions PXA-G2, PXA-R2, and PXA-B2 may be arranged to constitute a second pixel row PXL2 and may be configured to emit lights whose colors are different from each other but correspond to those of the first to third pixel regions PXA-G1, PXA-R1, and PXA-B1. However, the inventive concept is not limited to this example, and the arrangement of the pixel regions PXA-G1, PXA-R1, PXA-B1, PXA-G2, PXA-R2, and PXA-B2 or the colors of the lights emitted therefrom may be variously changed in a suitable manner. FIG. 3B exemplarily illustrates a cross-sectional structure of a region, on which some elements of the pixel PX (e.g., a driving transistor TR and the emission device EMD) are provided. As shown in FIG. 3B, the first display substrate 100 (or the lower display substrate) may include a first base substrate BS1, the pixel PX, signal lines GLi−1, GLi, GLi+1, DLj−1, DLj, DLj+1, and DLj+2, and a plurality of insulating layers including a first insulating layer 10, a second insulating layer 20, a third insulating layer 30, a fourth insulating layer 40, a fifth insulating layer 50 (or pixel definition layer), and a sixth insulating layer 60.

The first base substrate BS1 may include a synthetic resin substrate and/or a glass substrate. The insulating layers may include first to sixth insulating layers (first insulating layer 10, second insulating layer 20, third insulating layer 30, fourth insulating layer 40, fifth insulating layer 50, and sixth insulating layer 60), which are sequentially stacked on the first base substrate BS1, as exemplarily shown in FIG. 3B. Each of the first to sixth insulating layers 10, 20, 30, 40, 50, and 60 may be formed of or include at least one of inorganic or organic materials. For example, the first to third insulating layers 10, 20, and 30 may be inorganic layers, the fourth and fifth insulating layers 40 and 50 may be organic layers, and the sixth insulating layer 60 may be a multi-layer structure, in which organic and inorganic layers are stacked.

For example, the sixth insulating layer 60 may include two inorganic layers and an organic layer that is encapsulated or hermetically sealed by the inorganic layers. The inorganic layers may include a lower inorganic layer, which covers the emission device EMD and prevents or substantially prevents external moisture or oxygen from entering the emission device EMD. In an embodiment, the lower inorganic layer may be formed of or include at least one of silicon nitride, silicon oxide, or a compound thereof. The lower inorganic layer may be formed by a deposition process.

The organic layer may be disposed on the lower inorganic layer to be in contact with the lower inorganic layer. The organic layer on the lower inorganic layer may be provided to have a flat surface. The organic layer may cover an uneven structure, particles, or the like, which are present on the lower inorganic layer, and thus, it may be possible to prevent or substantially prevent a surface state of the top surface of the lower inorganic layer from affecting elements on the organic layer. In addition, the organic layer may relieve or reduce a stress between layers in contact with each other. The organic layer may be formed of or include an organic material and may be formed by a solution process (e.g., spin-coating, slit-coating, and/or inkjet processes).

An upper one of the inorganic layers (hereinafter, an upper inorganic layer) may be disposed on the organic layer to cover the organic layer. Because the organic layer has a relatively flat (i.e., flat or substantially flat) top surface, the upper inorganic layer may be more stably formed on the organic layer, compared to the case where the upper inorganic layer is formed (e.g., directly formed) on the lower inorganic layer. The upper inorganic layer may encapsulate the organic layer and may prevent or substantially prevent moisture from being leaked from the organic layer to the outside. The upper inorganic layer may be formed of or include at least one of silicon nitride, silicon oxide, or a compound thereof. The upper inorganic layer may be formed by a deposition process. However, the inventive concept is not limited to this example, and in an embodiment, at least one additional insulating layer, which is formed of or includes an inorganic material, may be further disposed on the upper insulating layer.

FIG. 3A exemplarily illustrates some of the signal lines (e.g., gate lines GL1-GLn and data lines DL1-DLm) of FIG. 2 (in particular, three gate lines GLi−1, GLi, and GLi+1, which are sequentially arranged, and four data lines DLj−1, DLj, DLj+1, and DLj+2, which are electrically disconnected from the gate lines and are sequentially arranged). The signal lines (e.g., three gate lines GLi−1, GLi, GLi+1, and three data lines DLj−1, DLj, DLj+1, and DLj+2) may be disposed in the peripheral region NPXA in such a way that they are not overlapped (e.g., overlapped in the third direction) with the pixel regions PXA-G1, PXA-R1, PXA-B1, PXA-G2, PXA-R2, and PXA-B2. In one or more embodiments, the gate lines GLi−1, GLi, and GLi+1 are disposed between the second insulating layer 20 and the third insulating layer 30, and the data lines DLj, DLj+1, and DLj+2 are disposed between the third insulating layer 30 and the fourth insulating layer 40 as illustrated in FIGS. 3B-3D. However the present disclosure is not limited to this example, and in one or more embodiments, if the gate lines GLi−1, GLi, and GLi+1 and the data lines DLj, DLj+1, and DLj+2 are disposed on different layers and are electrically disconnected from each other, vertical positions of the gate lines GLi−1, GLi, and GLi+1 and/or the data lines DLj, DLj+1, and DLj+2 may be variously changed in a suitable manner.

The driving transistor TR may include a control electrode CE and a semiconductor pattern SP. The control electrode CE may be disposed between the second insulating layer 20 and the third insulating layer 30, and the semiconductor pattern SP may be disposed between the first insulating layer 10 and the second insulating layer 20 to be spaced apart from the control electrode CE with the second insulating layer 20 interposed therebetween.

The semiconductor pattern SP may include an input region IA, an output region OA, and a channel region CA which are differentiated based on their doping concentrations or conductivity types. The channel region CA may be overlapped with the control electrode CE and may have relatively low conductance. The input region IA and the output region OA may have conductance higher than the channel region CA. The input and output regions IA and OA may be formed to have a doping concentration higher than that of the channel region CA, and in an embodiment, the input and output regions IA and OA may be formed through a reduction process. In one or more embodiments, one of the input and output regions IA and OA may be connected (e.g., electrically connected) to the emission device EMD through a connection electrode.

However, the inventive concept is not limited to this example, and the driving transistor TR may further include at least one of additional input and/or output electrodes that are provided regardless of the semiconductor pattern SP. The one or more input and/or output electrodes may be formed of at least one of semiconductor, metallic or conductive polymeric materials and may be coupled to the semiconductor pattern SP to constitute the driving transistor TR. The structure of the driving transistor TR in the pixel PX may be variously changed in a suitable manner, and the inventive concept is not limited to a specific structure of the driving transistor TR.

The emission device EMD may be disposed on the fourth insulating layer 40. The emission device EMD may include a first electrode E1, a second electrode E2, and a light emitting layer EML. One of the first electrode E1 and the second electrode E2 may serve as an anode and the other one of the first electrode E1 and the second electrode E2 may serve as a cathode.

The emission device EMD may generate the afore-described source light. In other words, the emission device EMD may generate the blue light and may provide the blue light to the second display substrate 200. The blue light may have a wavelength ranging from about 410 nm (e.g., 410 nm) to about 480 nm (e.g., 480 nm). The highest peak of a light-emitting spectrum of the blue light may be within a wavelength range of about 440 nm (e.g., 440 nm) to about 460 nm (e.g., 460 nm).

The first electrode E1 may be provided on the fourth insulating layer 40. An opening OP exposing at least a portion of the first electrode E1 may be defined in the fifth insulating layer 50. In one or more embodiments, the sidewalls or a single continuous sidewall of the fifth insulating layer 50 define the opening OP.

The light emitting layer EML may be disposed to be overlapped (e.g., overlapped in the third direction) with the opening OP. In the present embodiment, the light emitting layer EML may be a common single layer which is disposed in all of the pixel regions PXA-G1, PXA-R1, PXA-B1, PXA-G2, PXA-R2, and PXA-B2. In one or more embodiments, the light emitting layer EML may extend between different pixel regions PXA-G1, PXA-R1, PXA-B1, PXA-G2, PXA-R2, and PXA-B2 and may be overlapped (e.g., overlapped in the third direction) with the fifth insulating layer 50. Accordingly, source lights, which are emitted from the emission devices of the pixel regions PXA-G1, PXA-R1, PXA-B1, PXA-G2, PXA-R2, and PXA-B2, may be the same. However, the inventive concept is not limited to this example, and in an embodiment, the light emitting layer EML may be independently disposed in each of the pixel regions PXA-G1, PXA-R1, PXA-B1, PXA-G2, PXA-R2, and PXA-B2. For example, multiple light emitting layers EML may form a plurality of light-emitting patterns spaced apart from each other. Each of the plurality of light-emitting patterns may be on a corresponding one of the first electrodes.

The second electrode E2 may be provided on the light emitting layer EML. The second electrode E2 may be a common single layer which is disposed in all of the pixel regions PXA-G1, PXA-R1, PXA-B1, PXA-G2, PXA-R2, and PXA-B2. In one or more embodiments, the second electrode E2 may extend between different pixel regions PXA-G1, PXA-R1, PXA-B1, PXA-G2, PXA-R2, and PXA-B2 and may be overlapped (e.g., overlapped in the third direction) with the fifth insulating layer 50. The second electrode E2 may be optically transparent. Accordingly, light emitted from the light emitting layer EML may be provided or incident (e.g., easily incident) to the second display substrate 200 through the second electrode E2.

In one or more embodiments, the emission device EMD may further include at least one charge control layer, which is disposed between the first electrode E1 and the light emitting layer EML or between the second electrode E2 and the light emitting layer EML. The charge control layer may include a hole transport layer, a hole injection layer, an electron injection layer, or an electron transport layer and may have a single-layer or multi-layer structure.

The second display substrate 200 (or the upper display substrate) may include a second base substrate BS2, a color filter layer CFL, and a color control layer CCL. The second base substrate BS2 may include a synthetic resin substrate or a glass substrate.

The color filter layer CFL may be disposed on a bottom surface of the second base substrate BS2. The color filter layer CFL may include the first partitioning pattern BM1, a second partitioning pattern BM2, and a color filter CF.

The first partitioning pattern BM1 may be disposed on the bottom surface of the second base substrate BS2. The first partitioning pattern BM1 may substantially define the peripheral region NPXA. In the present embodiment, the first partitioning pattern BM1 may have a grid shape enclosing each of the pixel regions PXA-G1, PXA-R1, PXA-B1, PXA-G2, PXA-R2, and PXA-B2, when viewed in a plan view. In one or more embodiments, the partitioning pattern BM1 overlaps (e.g., overlaps in the third direction) the fifth insulating layer 50.

The opening BM-OP in the first partitioning pattern BM1 may be differently defined depending on optical characteristics of the first partitioning pattern BM1. For example, for the first partitioning pattern BM1 blocking or substantially blocking most of the visible light as in the present embodiment, the opening BM-OP may be formed to define each of the pixel regions PXA-G1, PXA-R1, PXA-B1, PXA-G2, PXA-R2, and PXA-B2. However, for the first partitioning pattern BM1 transmitting light of a specific color (e.g., at least one of red, green, or blue lights), the number of the openings BM-OP therein may be reduced.

The second partitioning pattern BM2 may be disposed on a bottom surface of the first partitioning pattern BM1. The second partitioning pattern BM2 may be formed along a first partitioning pattern BM1 and may have a planar shape corresponding to the second partitioning pattern BM2. Because the second partitioning pattern BM2 is smaller in area than the first partitioning pattern BM1, a portion of the first partitioning pattern BM1 may be exposed by the second partitioning pattern BM2.

The second partitioning pattern BM2 may be formed of or include a light-blocking material. For example, the second partitioning pattern BM2 may be formed of or include at least one of black dye, black pigment, or carbon black, metal (e.g., chromium), or metal oxide. Meanwhile, in an embodiment, one of the first partitioning pattern BM1 and the second partitioning pattern BM2 may be omitted from the display panel DP.

The color filter CF may be disposed on a bottom surface of the second base substrate BS2. The color filter CF may include a base resin and a dye and/or pigment dispersed in the base resin. The base resin may be a medium material, in which the dye and/or pigment is dispersed, and may be made of at least one of various resin composites, which are referred to as a "binder" generally.

The color filter CF may include first to third color filters (first color filter CF-G, second color filter CF-R, and third color filter CF-B) that are differentiated based on their colors. Each of the color filters CF-G, CF-R, and CF-B may be overlapped with a corresponding one of the pixel regions PXA-G1, PXA-R1, PXA-B1, PXA-G2, PXA-R2, and PXA-B2. Edges of the color filters CF-G, CF-R, and CF-B may be overlapped (e.g., overlapped in the third direction) with the peripheral region NPXA.

In the present embodiment, the edges of the color filters CF-G, CF-R, and CF-B may cover the first partitioning pattern BM1 and the second partitioning pattern BM2. In the peripheral region NPXA, the edges of the color filters CF-G, CF-R, and CF-B may be overlapped (e.g., overlapped in the third direction) with each other. Even when there is a color-mixing issue in an overlap region of the color filters CF-G, CF-R, and CF-B, such a color-mixing issue may be blocked by the first and second partitioning patterns BM1 and BM2 and may not be recognized by a user.

The color control layer CCL may include a color control pattern CP and a light-blocking pattern BW. The color control pattern CP may include a base resin and quantum dots, which are mixed or dispersed in the base resin. In the present embodiment, the color control pattern CP may be defined as a quantum-dot layer. The base resin may be a medium material, in which the quantum dots are dispersed, and may be formed of at least one of various resin composites, which are referred to as a "binder" generally. However, the inventive concept is not limited to this example, and in the present specification, if the quantum dots can be dispersed in a medium material, the medium material may be referred to as a base resin, regardless of its name, additional function, or constituents. The base resin may be a polymer resin. For example, the base resin may be acrylic resins, urethane resins, silicone resins, and/or epoxy resins. The base resin may be transparent.

Quantum dots may be particles causing a change in wavelength of an incident light. Each of the quantum dots may have a nanometer-order crystalline material consisting of hundreds to thousands of atoms and may exhibit an increase in band gap, due to its small size and the consequent quantum confinement effect. In the case where an energy of light incident to the quantum dots is larger than a band gap of the quantum dots, each of the quantum dots may absorb the light to transition to an excited state, and then, may emit light of a specific wavelength when returning to its ground state. The wavelength of the emitted light may be determined by the band gap. That is, by adjusting sizes or compositions of the quantum dots, it may be possible to control the quantum confinement effect and the light-emitting characteristics of the optical conversion pattern CCL.

The II-VI compounds may be selected from the group consisting of binary compounds (e.g., CdSe, CdTe, CdS, ZnS, ZnSe, ZnTe, ZnO, HgS, HgSe, HgTe, MgSe, and/or MgS), mixtures of the binary compounds, ternary compounds (e.g., CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS), mixtures of the ternary compounds, quaternary compounds (e.g., HgZnTeS, CdZnSeS, CdZnSeTe, CdZnSTe, CdHgSeS, CdHgSeTe, CdHgSTe, HgZnSeS, HgZnSeTe, and/or HgZnSTe), and mixtures of the quaternary compounds.

The compounds may be selected from the group consisting of ternary compounds (e.g., AgInS2, CuInS2, AgGaS2, and/or CuGaS2), mixtures of the ternary compounds, quaternary compounds (e.g., AgInGaS2 and CuInGaS2), and mixtures of the quaternary compounds.

The III-V compounds may be selected from the group consisting of binary compounds (e.g., GaN, GaP, GaAs, GaSb, AlN, AlP, AlAs, AlSb, InN, InP, InAs, and/or InSb), mixtures of the binary compounds, ternary compounds (e.g., GaNP, GaNAs, GaNSb, GaPAs, GaPSb, AlNP, AlNAs, AlNSb, AlPAs, AlPSb, InGaP, InAlP, InNP, InNAs, InNSb, InPAs, and/or InPSb), mixtures of the ternary compounds, quaternary compounds (e.g., GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb), and mixtures of the quaternary compounds. In an embodiment, the III-V compounds may further include one of the group II metals. For example, InZnP or the like may be selected as such a III-II-V compound.

The IV-VI compounds may be selected from the group consisting of binary compounds (e.g., SnS, SnSe, SnTe, PbS, PbSe, and/or PbTe), mixtures of the binary compounds, ternary compounds (e.g., SnSeS, SnSeTe, SnSTe, PbSeS, PbSeTe, PbSTe, SnPbS, SnPbSe, and/or SnPbTe), mixtures of the ternary compounds, quaternary compounds (e.g., SnPbSSe, SnPbSeTe, and/or SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform or substantially uniform concentration throughout the particle or may have a spatially varying concentration distribution in each particle. In certain embodiments, each of the quantum dots may have a core/shell structure, in which one quantum dot is enclosed by another quantum dot. An element contained in the shell may have a concentration gradient decreasing in a direction from an interface between the core and the shell toward a center of the core.

In an embodiment, the quantum dot may have a core-shell structure, which includes a core, which contains the afore-described nanometer-order crystalline material, and a shell surrounding the core. The shell of the quantum dot may be used as a protection layer, which prevents or substantially prevents chemical characteristics of the core from being changed and preserves the semiconductor property of the core, and/or may be used as a charging layer, which allows the quantum dot to have an electrophoretic property. The shell may have a single-layer structure or a multi-layer structure. An element contained in the shell may have a concentration gradient decreasing in a direction from an interface between the core and the shell toward a center of the core. For example, the shell of the quantum dot may be formed of or include oxide compounds of metallic or nonmetallic elements, semiconductor compounds, or any combination thereof.

For example, the oxide compounds of metallic or non-metallic elements may include binary compounds (e.g., $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$) and/or ternary compounds (e.g., $MgAl_2O_4$, $CoFe_2O_4$, $NiFe_2O_4$, and/or $CoMn_2O_4$), but the inventive concept is not limited to these examples.

In addition, the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb, but the inventive concept is not limited to these examples.

Each of the quantum dots may have a light-emitting wavelength spectrum whose full width half maximum (FWHM) is less than about 45 nm (in particular, less than about 40 nm or in more particular, less than about 30 nm), and in this case, it may be possible to realize improved color purity or color reproduction characteristics. Furthermore, because the quantum dots emit light radially (i.e., in a radial direction), it may be possible to improve a viewing angle property.

In an embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the inventive concept is not limited to these examples.

A wavelength or color of light emitted from the quantum dot may be determined by a particle size of the quantum dot, and thus, by providing quantum dots of various sizes, it may be possible to realize various colors (e.g., blue, red, and green colors).

The color control pattern CP may include a plurality of color control patterns (e.g., first to third color control patterns (first color control pattern CP-G, second color control pattern CP-R, and third color control pattern CP-B)), which are differentiated based on the color of the emitting light. The color control patterns CP-G, CP-R, and CP-B may be spaced apart from each other when viewed in a plan view, and in an embodiment, the color control patterns CP-G, CP-R, and CP-B may be respectively disposed in the pixel regions PXA-G1, PXA-R1, PXA-B1, PXA-G2, PXA-R2, and PXA-B2 according to the color of the emitting light.

Each of the color control patterns CP-G, CP-R, and CP-B may be overlapped (e.g., overlapped in the third direction) with two or more pixel regions. In addition, each of the color control patterns CP-G, CP-R, and CP-B may be overlapped (e.g., overlapped in the third direction) with at least two of the first electrodes E1, when viewed in a plan view. In the present embodiment, the color control patterns CP-G, CP-R, and CP-B may be spaced apart from each other in the first direction DR1, and each of them may have a shape extending in the second direction DR2.

Referring to FIG. 3C, one color control pattern CP-G may be disposed to be overlapped (e.g., overlapped in the third direction) with two pixel regions PXA-G1 and PXA-G2. The two pixel regions PXA-G1 and PXA-G2 may be regions that are adjacent to each other and emit light of the same color. According to an embodiment of the inventive concept, because the single color control pattern is disposed for the pixel regions emitting the light of the same color, it may be possible to simplify the patterning process and to improve the efficiency of the patterning process. However, the inventive concept is not limited to this example, and in an embodiment, the color control patterns CP-G, CP-R, and CP-B may be disposed for the pixel regions PXA-G1, PXA-R1, PXA-B1, PXA-G2, PXA-R2, and PXA-B2, respectively according to color of the emitting light.

The light-blocking pattern BW may be disposed between the color control patterns CP-G, CP-R, and CP-B. The light-blocking pattern BW may be disposed in the peripheral region NPXA. In one or more embodiments, the light-blocking pattern BW is between (e.g., between in the first direction) adjacent color control patterns. The light-blocking pattern BW may absorb light that is incident thereto. For example, the light-blocking pattern BW may be formed of or include at least one of black dye, black pigment, carbon black, metals, or metal oxides. Each of the color control patterns CP-G, CP-R, and CP-B may emit light in all directions. The light-blocking pattern BW may absorb light, which propagates from the color control patterns CP-G, CP-R, and CP-B toward the peripheral region NPXA, and thus, it may be possible to prevent or substantially prevent the color-mixing issue from occurring between the color control patterns CP-G, CP-R, and CP-B.

In an embodiment, the light-blocking pattern BW may reflect or scatter an incident light. For example, the light-blocking pattern BW may be configured to reflect or scatter light, which propagate from the color control patterns CP-G, CP-R, and CP-B toward the peripheral region NPXA, and this may allow the light to be emitted to the outside through an initially designed one of the pixel regions PXA-G1, PXA-R1, PXA-B1, PXA-G2, PXA-R2, and PXA-B2. In other words, the light-blocking pattern BW may be located such that light from the color control patterns CP-G, CP-R, and CP-B is reflected toward the respective color control patterns CP-G, CP-R, and CP-B. Accordingly, the light efficiency of the pixel regions PXA-G1, PXA-R1, PXA-B1, PXA-G2, PXA-R2, and PXA-B2 may be improved.

In the present embodiment, a filling layer FL may be disposed between the first display substrate 100 (or lower display substrate) and the second display substrate 200 (or upper display substrate). The filling layer FL may be provided between a bottom surface of the color control layer CCL and a top surface of the sixth insulating layer 60. The filling layer FL may fill a cell gap between the first display substrate 100 (or lower display substrate) and the second display substrate 200 (or upper display substrate).

Referring back to FIG. 3A, a plurality of the light-blocking patterns BW may be provided to be spaced apart from each other in the first direction DR1 and the second direction DR2. For example, the light-blocking pattern BW may include a first light-blocking pattern BW1, which is disposed at one side of the first pixel region PXA-G1 in the first direction DR1, and a second light-blocking pattern BW2, which is disposed at one side of the fourth pixel region PXA-G2 in the first direction DR1. The first pixel region PXA-G1 and the fourth pixel region PXA-G2 may be spaced apart from each other in the second direction DR2, and the first light-blocking pattern BW1 and the second light-blocking pattern BW2 may be spaced apart from each other in the second direction DR2, with a gap region SA interposed therebetween. In one or more embodiments, the first light-blocking pattern BW1 and the second light-blocking pattern BW2 may have a light transmittance of about 10% (e.g., 10%) or lower.

Each of the first and second light-blocking patterns BW1 and BW2 may include a plurality of patterns. Each of the pixel regions PXA-G1, PXA-R1, PXA-B1, PXA-G2, PXA-R2, and PXA-B2 may have short sides, which are parallel to the first direction DR1, and long sides, which are parallel to the second direction DR2.

Each of the first and second light-blocking patterns BW1 and BW2 may be disposed between opposite long sides of each adjacent pair of the pixel regions PXA-G1, PXA-R1, PXA-B1, PXA-G2, PXA-R2, and PXA-B2. For example, the first light-blocking pattern BW1 in the first pixel row PXL1 may be disposed between the long side of the first pixel region PXA-G1 and the long side of the second pixel region PXA-R1, which is opposite and adjacent to the first pixel region PXA-G1.

The light-blocking pattern BW may be designed in various suitable shapes. For example, the light-blocking pattern BW may have one of polygonal (e.g., rectangular), circular, and/or elliptical shapes. However, the inventive concept is not limited to this example, and the shape of the light-blocking pattern BW may be variously changed in any suitable manner, as long as a plurality of the light-blocking patterns BW are not overlapped (e.g., overlapped in the third direction) with the pixel regions PXA-G1, PXA-R1, PXA-B1, PXA-G2, PXA-R2, and PXA-B2 and are arranged in the first direction DR1 between the color control patterns CP-G, CP-R, and CP-B. The light-blocking pattern BW may be extended along or parallel to the data lines DLj−1, DLj, DLj+1, and DLj+2. In addition, the light-blocking pattern BW may be spaced apart from the gate lines GLi−1, GLi, and GLi+1, when viewed in a plan view. The light-blocking pattern BW may not be overlapped (e.g., overlapped in the third direction) with the gate lines GLi−1, GLi, and GLi+1. The gap region SA may be formed at a region overlapped (e.g., overlapped in the third direction) with the gate lines GLi−1, GLi, and GLi+1.

As shown in FIG. 3D, the light-blocking pattern BW may include the first light-blocking pattern BW1 and the second light-blocking pattern BW2. The first light-blocking pattern BW1 may be a light-blocking pattern that is disposed in the first pixel row PXL1, and the second light-blocking pattern BW2 may be a light-blocking pattern that is disposed in the second pixel row PXL2. The first light-blocking pattern BW1 and the second light-blocking pattern BW2 may be spaced apart from each other with the gap region SA interposed therebetween.

The gap region SA may be defined in a region, which is overlapped (e.g., overlapped in the third direction) with the gate line GLi of the first display substrate 100 (or lower display substrate). In the present embodiment, the filling layer FL may fill at least a portion of the gap region SA. The filling layer FL may cover the gap region SA and a bottom surface of the color control layer CCL. The filling layer FL may have an electrically insulating property. The filling layer FL may uniformly or substantially uniformly spread to other neighboring pixel regions through the gap region SA. This will be described in more detail below.

In the display panel DP according to an embodiment of the inventive concept, the light-blocking pattern BW may include a plurality of light-blocking patterns BW1 and BW2, which are spaced apart from each other with the gap region SA interposed therebetween. In an embodiment, a plurality of the gap regions SA, which are extended in the first direction DR1, may be arranged in the second direction DR2. Accordingly, it may be possible to prevent or substantially prevent the color-mixing issue from occurring between the pixel regions, which are spaced apart from each other in the second direction DR2 with the gap region SA interposed therebetween, and to improve the spreading property of the filling layer FL. Because the spreading property of the filling layer FL is improved, it may be possible to reduce the gap region between the display substrates and thereby to improve the light efficiency of the display panel DP.

Figure 4A:
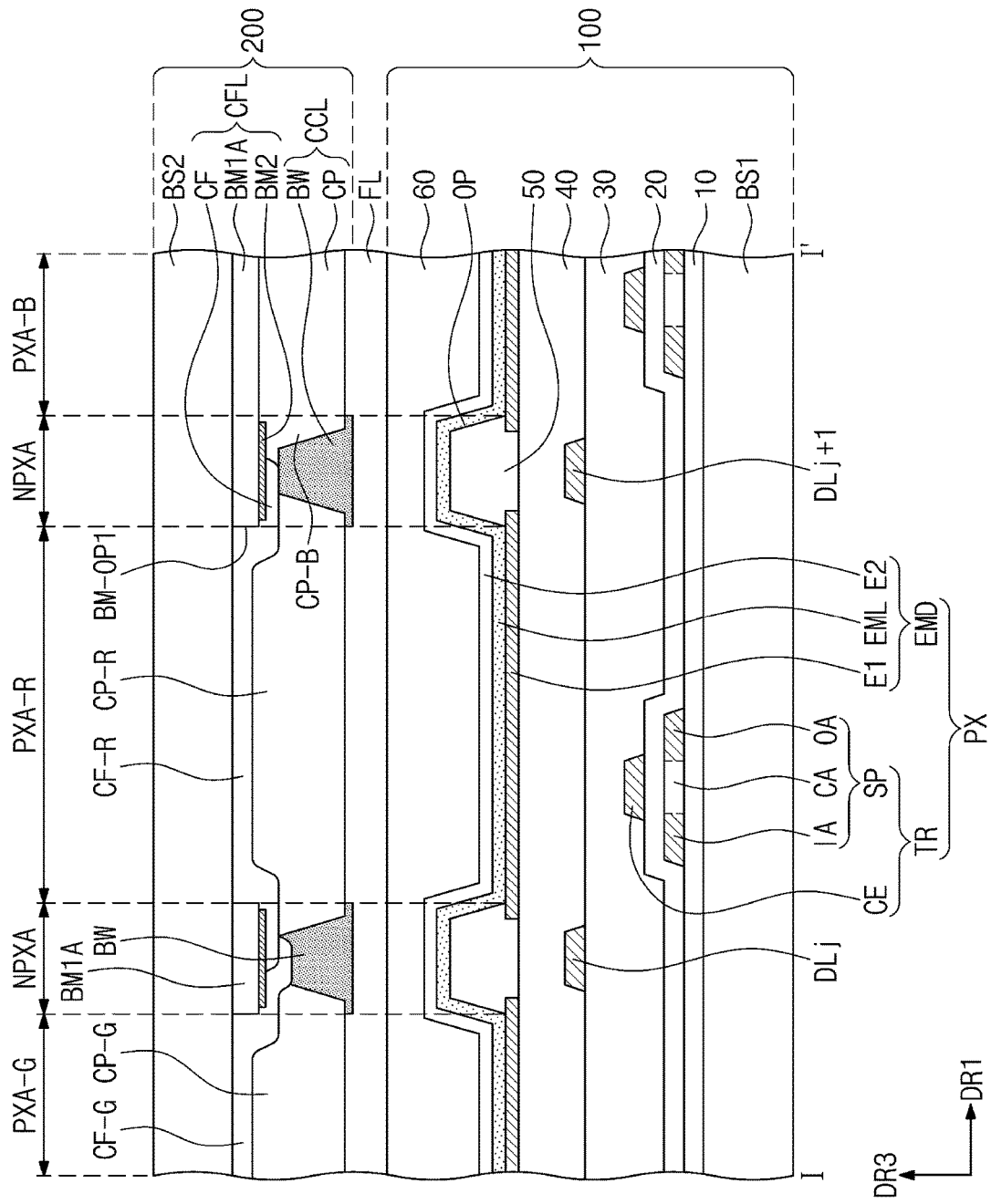
FIGS. 4A and 4B are cross-sectional views taken along the lines I-I' and III-III' respectively of FIG. 3A illustrating a display panel according to an embodiment of the inventive concept.
Figure 4B:
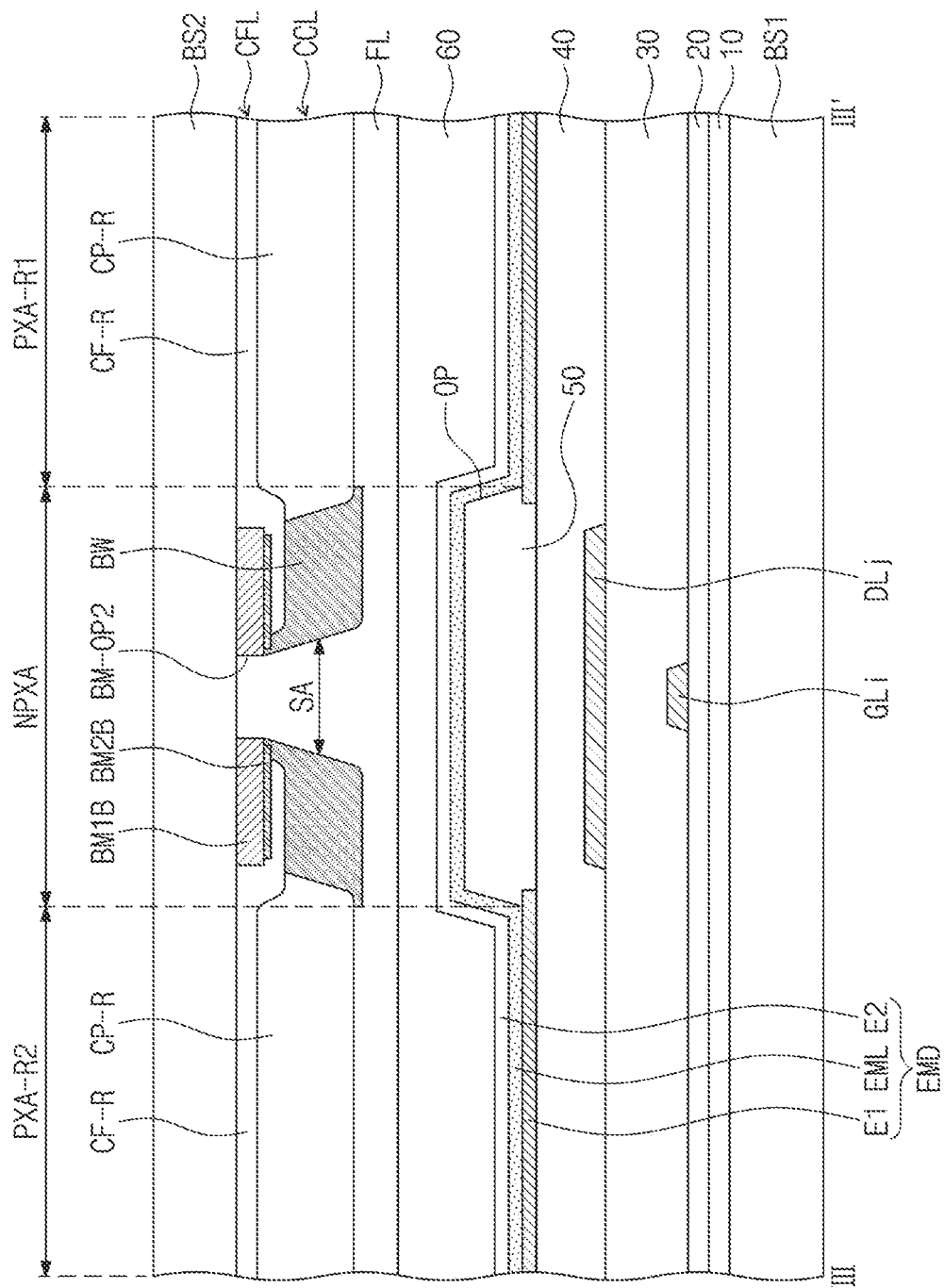

FIGS. 4A and 4B are cross-sectional views illustrating a display panel according to an embodiment of the inventive concept. FIG. 4A illustrates a region of the electronic panel corresponding to FIG. 3B, and FIG. 4B illustrates a region of the electronic panel corresponding to FIG. 3D. Hereinafter, an embodiment of the inventive concept will be described in more detail with reference to FIGS. 4A and 4B. Meanwhile, for concise description, an element previously described with reference to FIGS. 1A-3D may be identified by the same reference number without repeating a description thereof.

As shown in FIG. 4A, the display panel may include a first partitioning pattern BM1A, which transmits light of a specific color. For example, the first partitioning pattern BM1A may transmit a blue light.

The first partitioning pattern BM1A may be disposed to be overlapped (e.g., overlapped in the third direction) with not only the peripheral region NPXA but also some of the pixel regions (e.g., the third and the sixth pixel regions PXA-B1 and PXA-B2 for emitting the blue light). In other words, the partitioning pattern BM1A may extend from a pixel region (e.g., the third or the sixth pixel regions PXA-B1 and PXA-B2 for emitting the blue light) into the peripheral region NPXA. The first partitioning pattern BM1A may be disposed in a region, in which the color filter CF-B of FIG. 3B is disposed, and in this case, the color filter CF-B may be omitted. An opening BM-OP1 defined in the first partitioning pattern BM1A may be formed to have a shape different from the opening BM-OP of the first partitioning pattern BM1 shown in FIG. 3B.

As shown in FIG. 4B, a first partitioning pattern BM1B and a second partitioning pattern BM2B may have shapes corresponding to the light-blocking pattern BW. That is, the first partitioning pattern BM1B and the second partitioning pattern BM2B may be provided to define an opening BM-OP2 corresponding to the gap region SA of the light-blocking pattern BW. Accordingly, in the gap region SA, the filling layer FL may be in contact with a portion of a bottom surface of the second base substrate BS2 that is not covered with the first partitioning pattern BM1B and the second partitioning pattern BM2B.

Figure 5A:
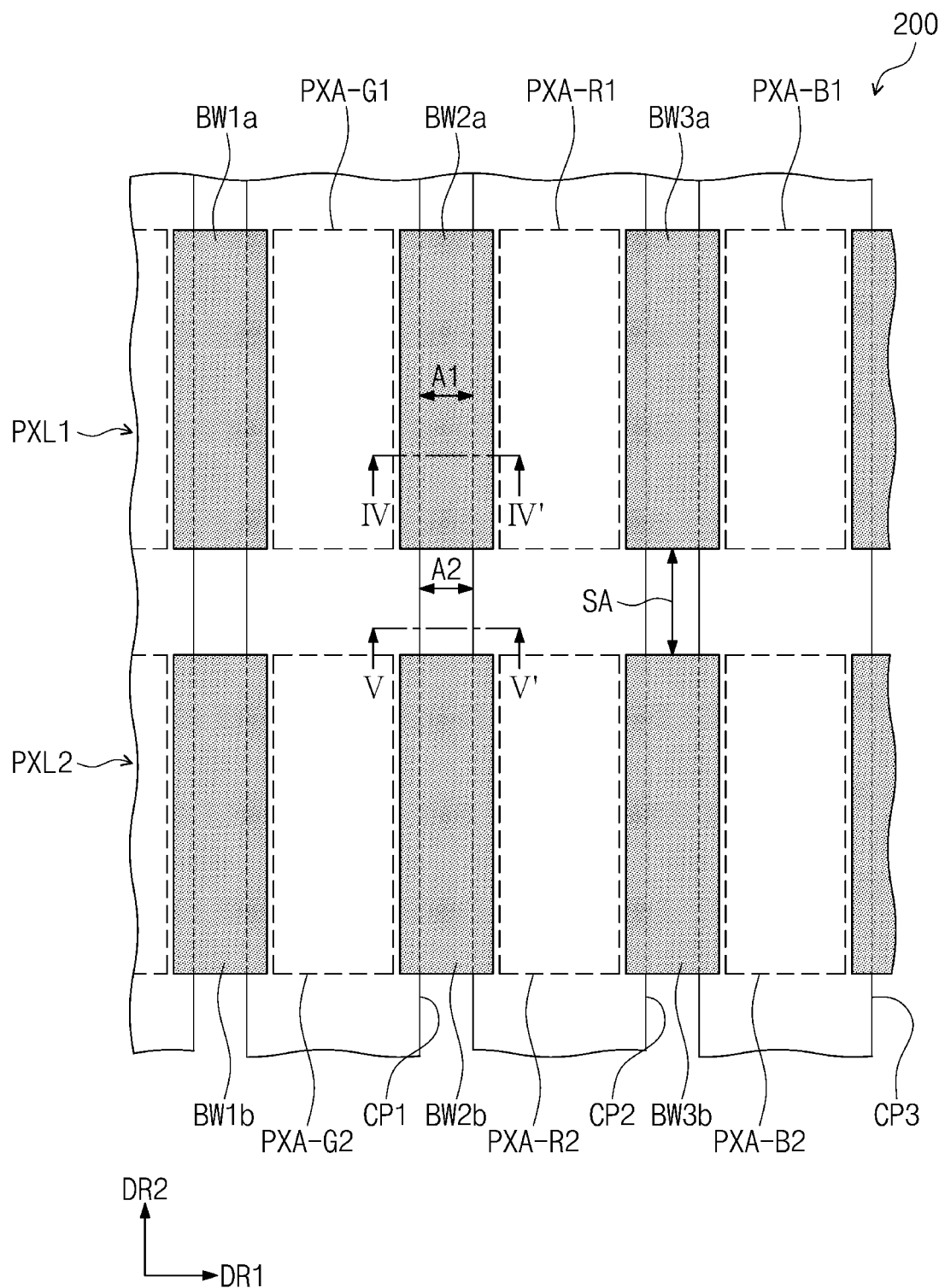
FIG. 5A is a plan view illustrating a portion of a display panel according to an embodiment of the inventive concept.
Figure 5B:
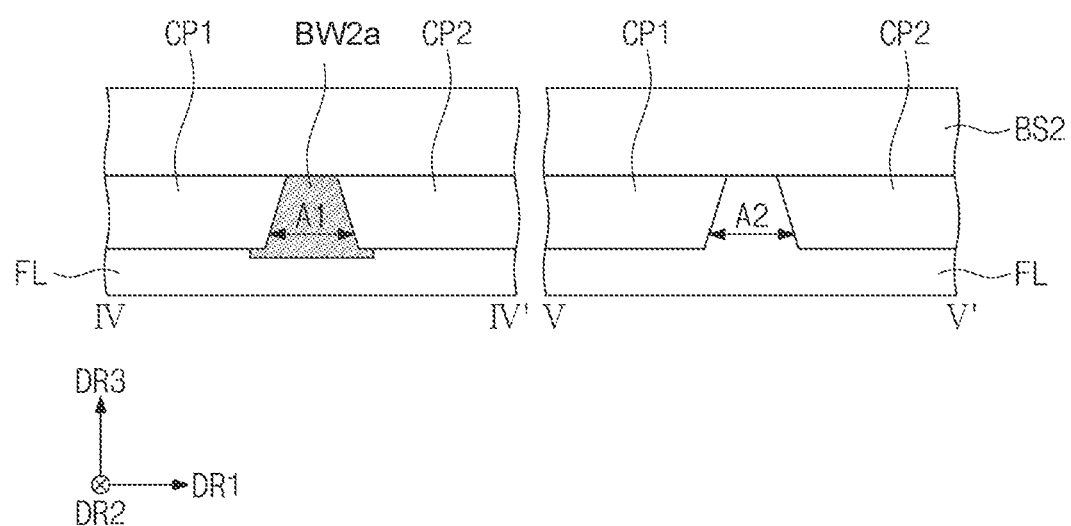
FIG. 5B is a cross-sectional view taken along the lines IV-IV' and V-V of FIG. 5A illustrating a portion of a display panel according to an embodiment.

FIG. 5A is a plan view illustrating a portion of a display panel according to an embodiment of the inventive concept. FIG. 5B is a cross-sectional view illustrating a region of FIG. 5A. In order to reduce complexity in the drawings and to provide better understanding of the present embodiment, FIG. 5A illustrates the plan view of the second display substrate 200 (or the upper display substrate), and the pixel regions PXA-G1, PXA-R1, PXA-B1, PXA-G2, PXA-R2, and PXA-B2 are depicted by the dotted lines. Also, only some elements of the second display substrate 200 (or the upper display substrate) (e.g., the second base substrate BS2 and the color control layer CCL) are exemplarily illustrated in FIG. 5B.

As described above, the second display substrate 200 (or the upper display substrate) may include a plurality of light-blocking patterns BW1a, BW2a, BW3a, BW1b, BW2b, and BW3b. For example, the light-blocking patterns may include first-row light-blocking patterns BW1a, BW2a, and BW3a constituting the first pixel row PXL1 and second-row light-blocking patterns BW1b, BW2b, and BW3b constituting the second pixel row PXL2.

The first-row light-blocking patterns BW1a, BW2a, and BW3a and the second-row light-blocking patterns BW1b, BW2b, and BW3b may be spaced apart from each other in the second direction DR2 with the gap region SA interposed therebetween. The first-row light-blocking patterns BW1a, BW2a, and BW3a and the second-row light-blocking patterns BW1b, BW2b, and BW3b may be extended in the second direction DR2 and may be arranged in the first direction DR1.

Color control patterns CP1, CP2, and CP3 may be extended in the second direction DR2 and may be spaced apart from each other in the first direction DR1.

In the present embodiment, the light-blocking patterns arranged in the second direction DR2 may be disposed between two adjacent ones of the color control patterns. For example, one of the first-row light-blocking patterns (e.g., BW2a) and one of the second-row light-blocking patterns (e.g., BW2b) may be disposed between the first color control pattern CP1 and the second color control pattern CP2.

In the present embodiment, a space between two color control patterns adjacent to each other in the second direction DR2 may be divided into a first region A1 and a second region A2.

The first region A1 may be a region that is covered with a corresponding one of the first-row light-blocking patterns BW1a, BW2a, and BW3a and the second-row light-blocking patterns BW1b, BW2b, and BW3b. For example, the first region A1 may be a region that is located between the pixel regions PXA-G1, PXA-R1, PXA-B1, PXA-G2, PXA-R2, and PXA-B2. The second region A2 may be a region that is spaced apart from the first-row light-blocking patterns BW1a, BW2a, and BW3a and the second-row light-blocking patterns BW1b, BW2b, and BW3b. In other words, the second region A2 may not be overlapped (e.g., overlapped in the third direction) with the first-row light-blocking patterns BW1a, BW2a, and BW3a and the second-row light-blocking patterns BW1b, BW2b, and BW3b. The second region A2 may be a region that is exposed through the gap region SA and is not covered with the light-blocking patterns BW1a, BW2a, and BW3a.

In an embodiment, the first region A1 may be disposed between the pixel regions, and the second region A2 may be disposed between the peripheral region NPXA. According to an embodiment of the inventive concept, the light-blocking pattern may be removed from a portion of the peripheral region NPXA (e.g., the second region A2) that is not vulnerable to the color-mixing issue between adjacent ones of the pixel regions, and thus, it may be possible to suppress the deterioration of the display quality, which may occur when the light-blocking pattern is absent.

Referring to FIG. 5B, the first region A1 between the first color control pattern CP1 and the second color control pattern CP2 may be covered with the light-blocking pattern BW. The filling layer FL may not fill the first region A1 and may cover the light-blocking pattern BW.

Referring to FIG. 5B, the second region A2 between the first color control pattern CP1 and the second color control pattern CP2 may not be covered with the light-blocking pattern BW. The filling layer FL may cover the color control patterns CP1 and CP2 and may fill the second region A2. Accordingly, the filling layer FL may be moved (e.g., easily moved) between two pixel regions, which are adjacent to each other in the second direction DR2 with the light-blocking pattern BW interposed therebetween, and thus, the filling layer FL may uniformly or substantially uniformly spread throughout the pixel regions PXA-G1, PXA-R1, PXA-B1, PXA-G2, PXA-R2, and PXA-B2. As a result, it may be possible to prevent or substantially prevent the color-mixing issue from occurring between the color control patterns CP1, CP2, and CP3 and to improve the spreading property of the filling layer FL.

FIGS. 6A-6D are plan views, each of which illustrates a portion of a display panel according to an embodiment of the inventive concept. FIGS. 6A-6D illustrate a region corresponding to FIG. 5A. Hereinafter, the display panels according to some example embodiments of the inventive concept will be described with reference to FIGS. 6A-6D.

Figure 6A:
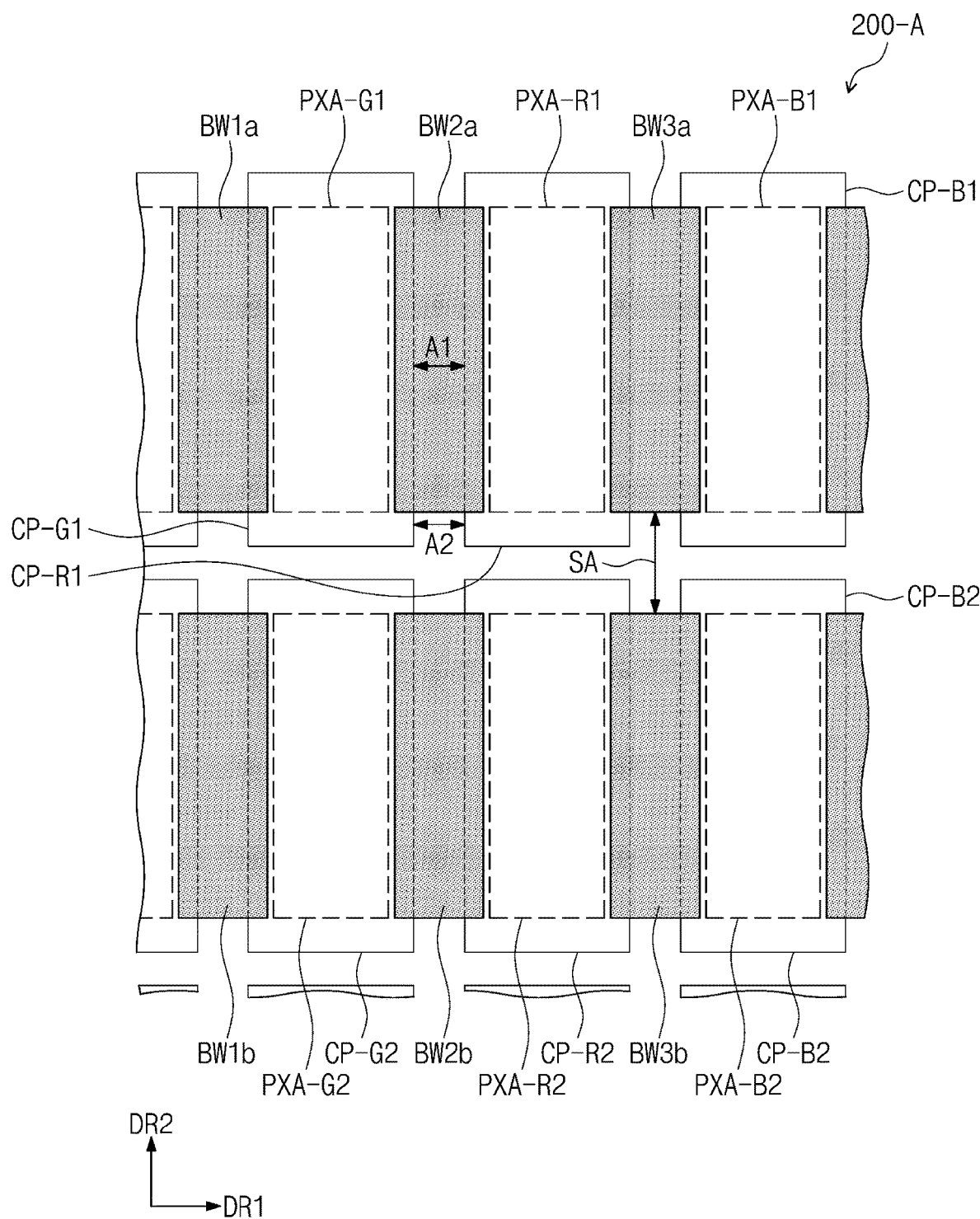
FIGS. 6A-6D are plan views, each of which illustrates a portion of a display panel according to an embodiment of the inventive concept.

As shown in FIG. 6A, an upper display substrate 200-A may include color control patterns CP-G1, CP-R1, CP-B1, CP-G2, CP-R2, and CP-B2, which are disposed to correspond to the pixel regions PXA-G1, PXA-R1, PXA-B1, PXA-G2, PXA-R2, and PXA-B2, respectively. Each of the color control patterns CP-G1, CP-R1, CP-B1, CP-G2, CP-R2, and CP-B2 may be disposed to be overlapped (e.g., overlapped in the third direction) with a corresponding one of the pixel regions. According to an embodiment of the inventive concept, a plurality of separated patterns may be provided for pixel regions emitting lights of the same color, and the design of the pixel arrangement may be variously changed in a suitable manner.

Figure 6B:
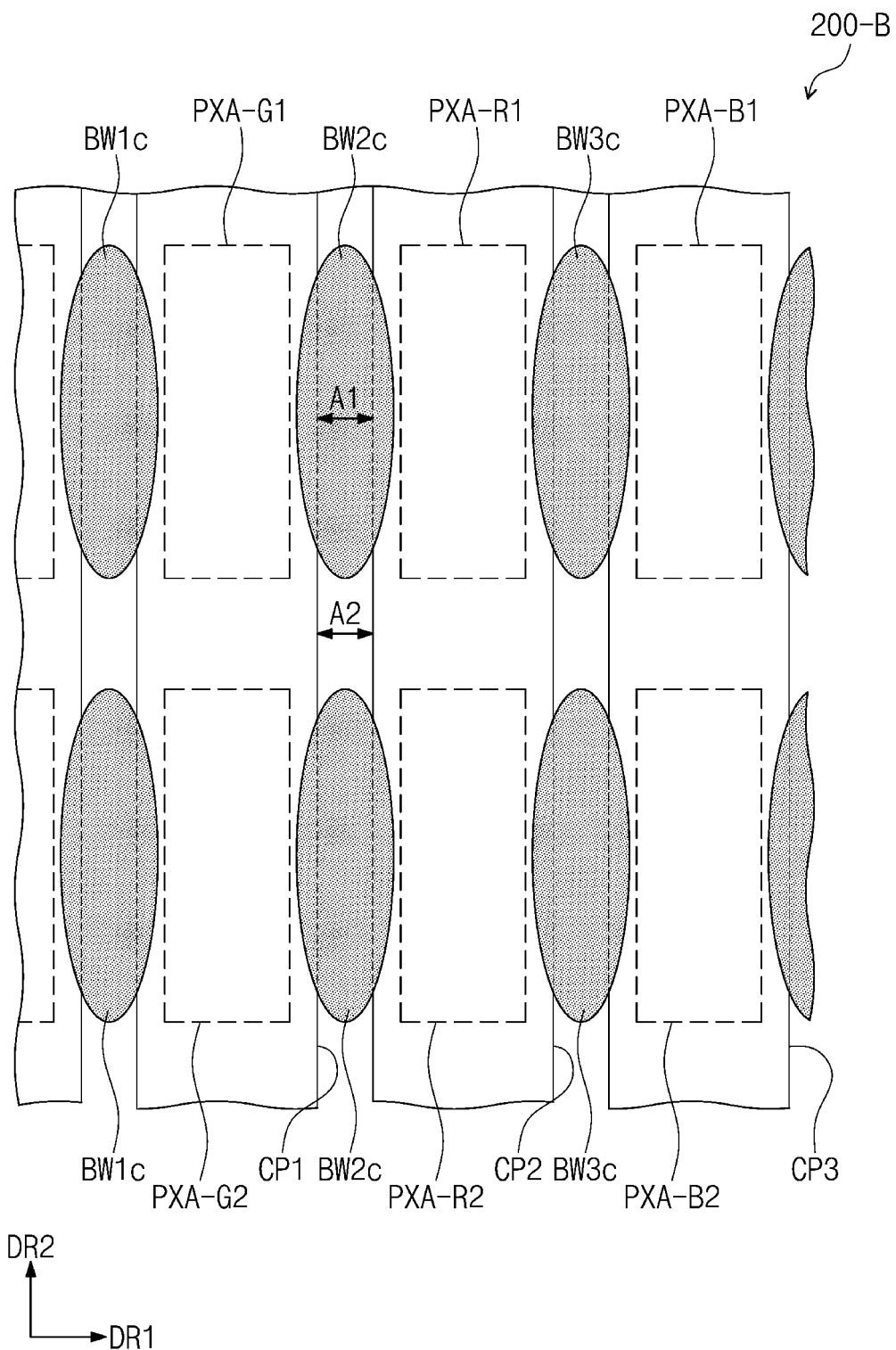

As shown in FIG. 6B, an upper display substrate 200-B may include light-blocking patterns BW1c, BW2c, and BW3c, each of which is provided in an elliptical shape. The light-blocking patterns BW1c, BW2c, and BW3c may be provided to cover the first region A1 and to expose the second region A2.

Figure 6C:
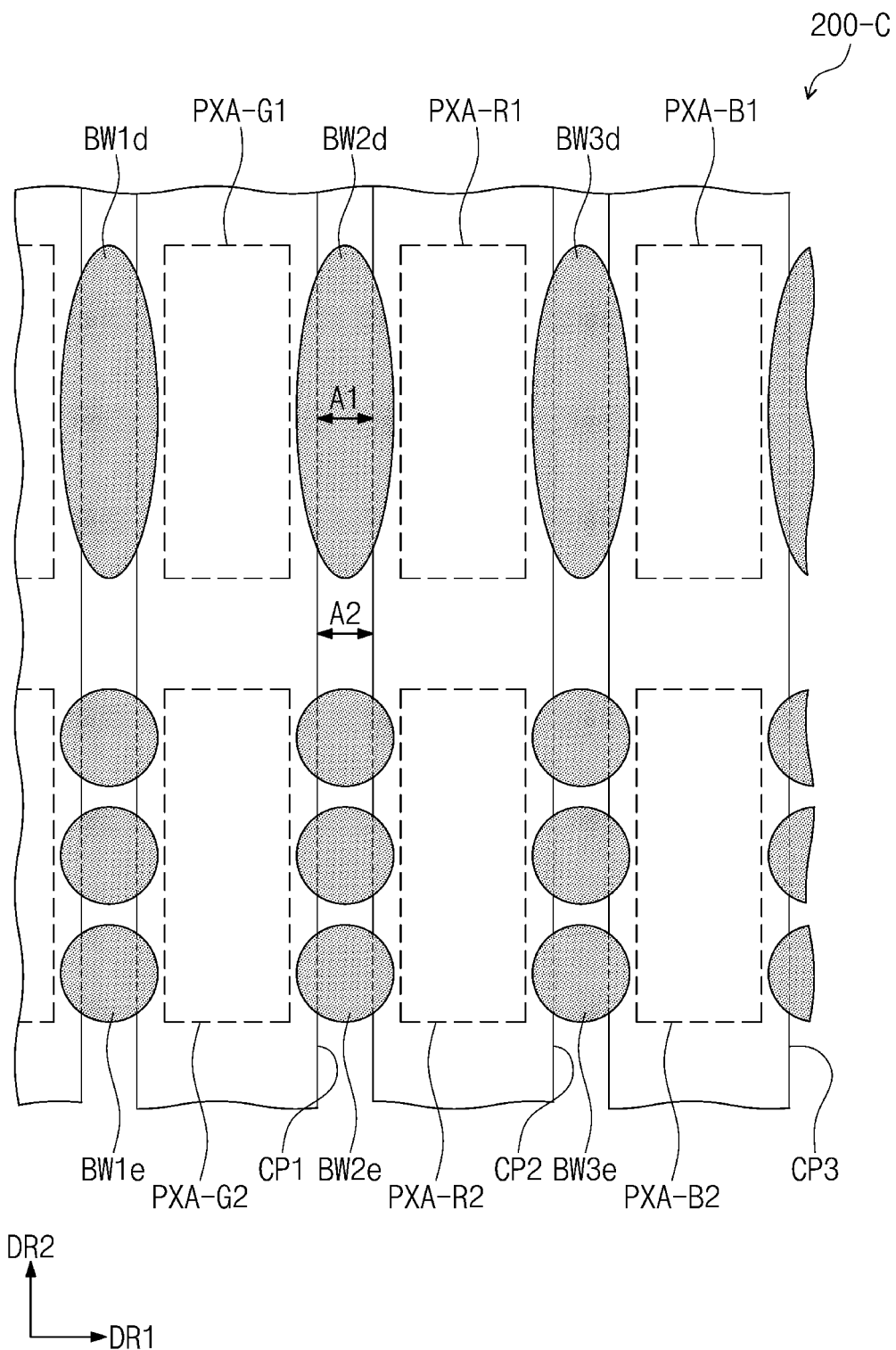

As shown in FIG. 6C, an upper display substrate 200-C may include first light-blocking patterns BW1d, BW2d, and BW3d and second light-blocking patterns BW1e, BW2e, and BW3e, whose shapes are different from the first light-blocking patterns BW1c, BW2c, and BW3c. For example, the light-blocking patterns BW2d and BW2e, which are disposed between the first color control pattern CP1 and the second color control pattern CP2 and constitute the same column, may have at least two different shapes (e.g., an elliptical shape and a circular pattern).

The first light-blocking patterns BW1d, BW2d, and BW3d may have an elliptical shape. The second light-blocking patterns BW1e, BW2e, and BW3e may include a plurality of circular patterns.

Figure 6D:
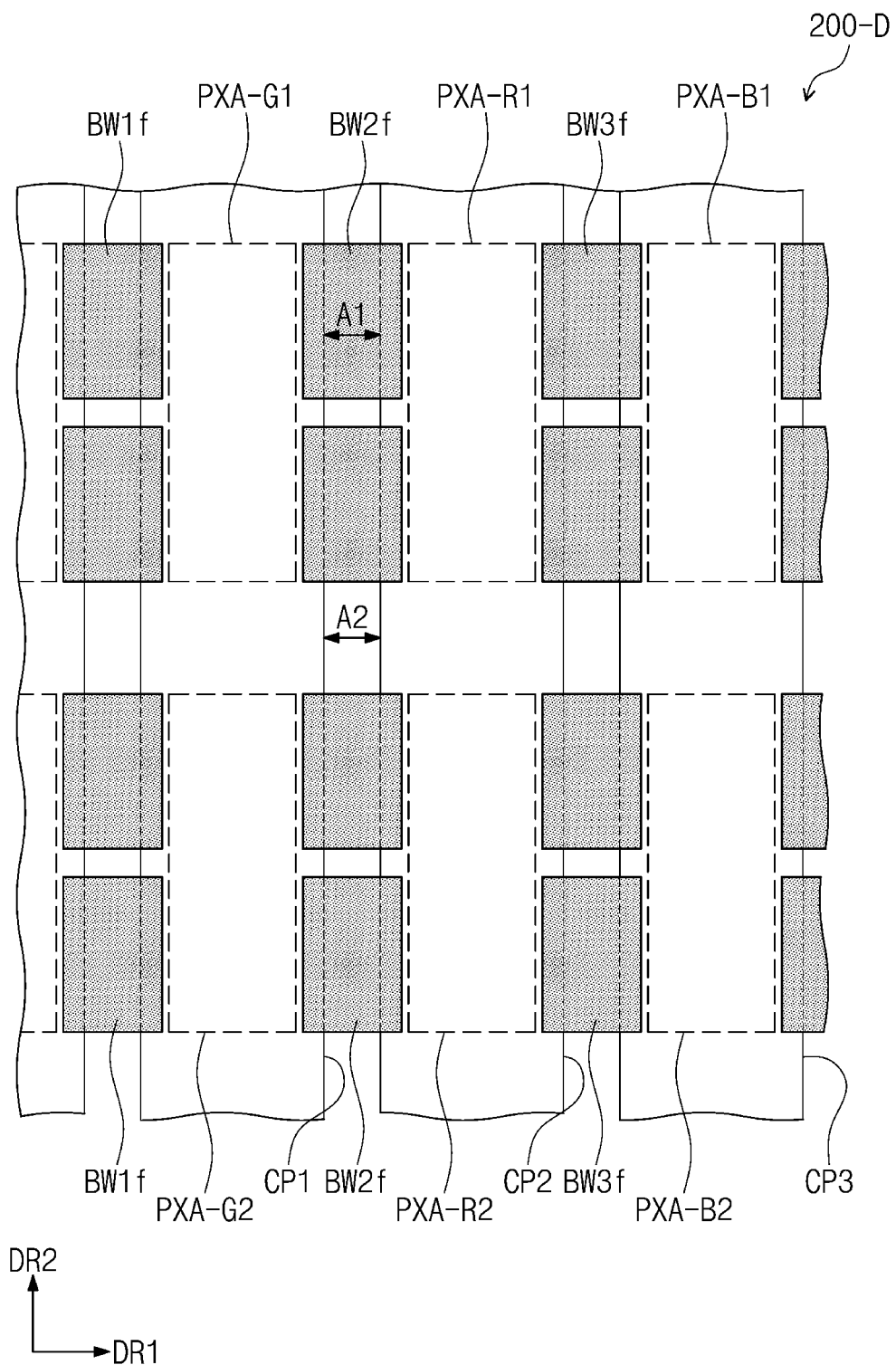

As shown in FIG. 6D, an upper display substrate 200-D may include a plurality of light-blocking patterns BW1f, BW2f, and BW3f, which are disposed between each adjacent pair of the pixel regions.

According to an embodiment of the inventive concept, the light-blocking patterns may be designed to have various shapes. In particular, in the case where the gap region SA is formed between the light-blocking patterns, the filling layer FL may uniformly or substantially uniformly spread throughout the pixel regions PXA-G1, PXA-R1, PXA-B1, PXA-G2, PXA-R2, and PXA-B2, and this may make it possible to prevent or substantially prevent the cell gap between the upper and lower display substrates from having an excessive large size and thereby improving the light efficiency of the display panel.

According to an embodiment of the inventive concept, it may be possible to prevent or substantially prevent a color-mixing issue between pixel regions and thereby to improve display quality of a display panel. In addition, according to an embodiment of the inventive concept, a filling layer may be uniformly or substantially uniformly formed throughout the pixel regions, and in this case, it may be possible to prevent or substantially prevent a cell gap from being increased and thereby improving light efficiency of the display panel.

While example embodiments of the inventive concept have been particularly shown and described, it will be understood by one of ordinary skill in the art that variations in form and detail may be made therein without departing from the spirit and scope of the attached claims, and equivalents thereof.

What is claimed is:

1. A display panel, comprising
  a first display substrate comprising first electrodes and a pixel definition layer, the pixel definition layer including openings exposing the first electrodes; and
  a second display substrate on the first display substrate, the second display substrate comprising a plurality of pixel regions and a peripheral region adjacent to the pixel regions,
  wherein the second display substrate comprises
    a first color control pattern configured to emit light of a first color,
    a second color control pattern spaced apart from the first color control pattern in a first direction and configured to emit light of a second color different from the first color, and
    a first light-blocking pattern and a second light-blocking pattern in the peripheral region between the first color control pattern and the second color control pattern, and
  wherein the first light-blocking pattern and the second light-blocking pattern are spaced apart from each other, in a second direction crossing the first direction, to define a gap region, the first and second directions being parallel to the second display substrate.

2. The display panel of claim 1, wherein the display panel further comprises a filling layer in the gap region between the first display substrate and the second display substrate.

3. The display panel of claim 2, wherein the filling layer covers the first color control pattern, the second color control pattern, the first light-blocking pattern, and the second light-blocking pattern.

4. The display panel of claim 1, wherein the pixel regions comprise:
  a first pixel row comprising a first pixel region overlapped with the first color control pattern and a second pixel region overlapped with the second color control pattern; and
  a second pixel row comprising a third pixel region overlapped with the first color control pattern and a fourth pixel region overlapped with the second color control pattern, the second pixel row being spaced apart from the first pixel row in the second direction,
  wherein the first light-blocking pattern is between the first pixel region and the second pixel region, and wherein the second light-blocking pattern is between the third pixel region and the fourth pixel region.

5. The display panel of claim 4, wherein the second display substrate comprises:
- a first color filter extended in the second direction and overlapped with the first pixel region and the third pixel region; and
- a second color filter extended in the second direction, overlapped with the second pixel region and the fourth pixel region, and spaced apart from the first color filter in the first direction, and wherein the first color filter and the second color filter are configured to filter different colors from each other.

6. The display panel of claim 4, wherein the second display substrate comprises a first color filter, a second color filter, a third color filter, and a fourth color filter, each of the first color filter, the second color filter, the third color filter, and the fourth color filter are spaced apart from each other in the first direction and the second direction, and overlapped with a corresponding one of the first pixel region, the second pixel region, the third pixel region, and the fourth pixel region.

7. The display panel of claim 1, wherein at least one of the first light-blocking pattern or the second light-blocking pattern comprises a plurality of patterns that are spaced apart from each other in the second direction.

8. The display panel of claim 1, wherein the first light-blocking pattern and the second light-blocking pattern have different shapes from each other.

9. The display panel of claim 1, wherein the first display substrate comprises:
- a gate line extending in the first direction; and
- a data line extending in the second direction and crossing the gate line, wherein the data line and the gate line are electrically disconnected from each other, and wherein the gate line is overlapped with the gap region.

10. The display panel of claim 9, wherein the data line is overlapped with the first light-blocking pattern and the second light-blocking pattern.

11. The display panel of claim 1, wherein the first display substrate comprises a plurality of light-emitting patterns comprising a first light-emitting pattern and a second light-emitting pattern, the first light-emitting pattern and the second light-emitting pattern being on a corresponding one of the first electrodes and being spaced apart from each other, and wherein the first light-emitting pattern and the second light-emitting pattern are overlapped with the first color control pattern and the second color control pattern, respectively.

12. The display panel of claim 1, wherein the first display substrate comprises a single light emitting layer covering the first electrodes and the pixel definition layer.

13. The display panel of claim 12, wherein the light emitting layer is configured to emit a blue light.

14. The display panel of claim 1, wherein the first color control pattern and the second color control pattern comprise quantum dots.

15. The display panel of claim 1, wherein the first light-blocking pattern and the second light-blocking pattern have light transmittance of about 10% or lower.

16. The display panel of claim 1, wherein the first light-blocking pattern and the second light-blocking pattern comprise an optically reflective material.

17. The display panel of claim 1, wherein at least one of the first light-blocking pattern or the second light-blocking pattern has a circular, elliptical, or polygonal shape when viewed in a plan view.

18. The display panel of claim 1, wherein the second display substrate further comprises a partitioning pattern defining the peripheral region and having a grid shape enclosing the pixel regions, and wherein the partitioning pattern comprises a light-blocking material.

19. The display panel of claim 18, wherein the partitioning pattern defines an opening overlapped with the gap region.

20. The display panel of claim 1, wherein each of the pixel regions comprises short sides parallel to the first direction and long sides connected to the short sides and parallel to the second direction, and wherein the first light-blocking pattern and the second light-blocking pattern are between opposite long sides of different ones of the pixel regions.

* * * * *